US011017731B2

(12) United States Patent
Park et al.

(10) Patent No.: US 11,017,731 B2
(45) Date of Patent: May 25, 2021

(54) IMAGE DISPLAY APPARATUS CAPABLE OF DETERMINING FAILURE

(71) Applicant: LG ELECTRONICS INC., Seoul (KR)

(72) Inventors: Daeyoung Park, Seoul (KR); Sunghun Kim, Seoul (KR); Taehun Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/494,739

(22) PCT Filed: Mar. 15, 2017

(86) PCT No.: PCT/KR2017/002802
§ 371 (c)(1),
(2) Date: Sep. 16, 2019

(87) PCT Pub. No.: WO2018/169104
PCT Pub. Date: Sep. 20, 2018

(65) Prior Publication Data
US 2020/0098322 A1 Mar. 26, 2020

(51) Int. Cl.
*G09G 3/34* (2006.01)
*G09G 3/36* (2006.01)
*G09G 3/3275* (2016.01)

(52) U.S. Cl.
CPC ......... *G09G 3/3406* (2013.01); *G09G 3/3685* (2013.01); *G09G 3/3275* (2013.01); *G09G 2310/0243* (2013.01); *G09G 2310/08* (2013.01); *G09G 2320/0606* (2013.01);
(Continued)

(58) Field of Classification Search
CPC ....... G09G 2310/0243; G09G 2310/08; G09G 2320/0606; G09G 2330/04; G09G 2330/12; G09G 2354/00; G09G 2370/022; G09G 2370/16; G09G 3/3275; G09G 3/3406;
(Continued)

(56) References Cited

U.S. PATENT DOCUMENTS

| 2014/0084792 A1* | 3/2014 | Oh | G09G 3/00 |
| | | | 315/120 |
| 2016/0267833 A1* | 9/2016 | Lee | G09G 3/3406 |
| 2017/0213490 A1* | 7/2017 | Jeong | G09G 3/006 |

* cited by examiner

*Primary Examiner* — Afroza Chowdhury
(74) *Attorney, Agent, or Firm* — Lee, Hong, Degerman, Kang & Waimey PC

(57) ABSTRACT

The present disclosure relates to an image display apparatus. The image display apparatus according to an embodiment of the present disclosure includes a controller to output an image signal and a first DC power; and a display to receive the image signal, the first DC power, and a second DC power, wherein the display includes: a first interface to receive the image signal and the first DC power; a timing controller to output a data driving signal and a gate driving signal; a panel to display an image; a second interface to receive a second DC power; a backlight to output light to the panel based on the second DC power; and a first current detector to detect a first current based on the first DC, wherein the controller determines that the timing controller or the panel is failed, when the detected first current deviates from a first allowable range. Accordingly, it is possible to easily determine whether there is a failure in the image display apparatus that can be installed externally.

18 Claims, 27 Drawing Sheets

(52) U.S. Cl.
CPC ..... *G09G 2330/12* (2013.01); *G09G 2354/00* (2013.01); *G09G 2370/022* (2013.01)

(58) Field of Classification Search
CPC ........ G09G 3/3685; G09G 5/00; H04N 13/00; H04N 5/44; H05K 7/20
See application file for complete search history.

(a)

810

(b)

815

(a)

(b)

IMAGE DISPLAY APPARATUS CAPABLE OF DETERMINING FAILURE

CROSS-REFERENCE TO RELATED APPLICATIONS

This application is the National Stage filing under 35 U.S.C. 371 of International Application No. PCT/KR2017/002802, filed on Mar. 15, 2017, the contents of which are hereby incorporated by reference herein its entirety.

TECHNICAL FIELD

The present disclosure relates to an image display apparatus, and more particularly, to an image display apparatus capable of easily determining a failure in an image display apparatus that can be installed externally.

BACKGROUND ART

An image display apparatus is an apparatus for outputting an image. The image display apparatus may be implemented in a various manners such as a scheme of outputting an image through a display panel, or a scheme of projecting an image to the outside by using visible light.

Meanwhile, as a commercial image display apparatus, the tendency to externally dispose an image display apparatus is increasing. Meanwhile, in an image display apparatus disposed outside, when a failure occurs, there is a problem that an administrator who is remotely located can not quickly determine whether the image display apparatus is failed.

DISCLOSURE

Technical Problem

An object of the present disclosure is to provide an image display apparatus which can easily determine whether a failure occurs in an image display apparatus that can be installed externally.

Another object of the present disclosure is to provide an image display apparatus which can determine a fault location in an image display apparatus that can be installed externally.

Technical Solution

In an aspect, there is provided an image display apparatus, including: a controller to output an image signal and a first DC power; and a display to receive the image signal, the first DC power, and a second DC power, and display a certain image based on the image signal, wherein the display includes: a first interface to receive the image signal and the first DC power from the controller; a timing controller to output a data driving signal and a gate driving signal based on the image signal; a panel to display an image according to the data driving signal and the gate driving signal; a second interface to receive a second DC power; a backlight to output light to the panel based on the second DC power; and a first current detector to detect a first current based on the first DC power applied to the first interface, wherein the controller determines that the timing controller or the panel is failed, when the detected first current deviates from a first allowable range.

In another aspect, there is provided an image display apparatus, including: a controller to output an image signal and a first DC power; and a display to receive the image signal, the first DC power, and a second DC power, and display a certain image based on the image signal, wherein the display includes: a first interface to receive the image signal and the first DC power from the controller; a timing controller to output a data driving signal and a gate driving signal based on the image signal; a panel to display an image according to the data driving signal and the gate driving signal; a second interface to receive a second DC power; a data driver to output a data signal to the panel based on the second DC power; and a first current detector to detect a first current based on the first DC power applied to the first interface, wherein the controller determines that the timing controller or the panel is failed, when the detected first current deviates from a first allowable range.

Advantageous Effects

According to an embodiment of the present disclosure, an image display apparatus includes a controller to output an image signal and a first DC power; and a display to receive the image signal, the first DC power, and a second DC power, and display a certain image based on the image signal, wherein the display includes: a first interface to receive the image signal and the first DC power from the controller; a timing controller to output a data driving signal and a gate driving signal based on the image signal; a panel to display an image according to the data driving signal and the gate driving signal; a second interface to receive a second DC power; a backlight to output light to the panel based on the second DC power; and a first current detector to detect a first current based on the first DC power applied to the first interface, wherein the controller determines that the timing controller or the panel is failed, when the detected first current deviates from a first allowable range. Accordingly, it is possible to easily determine whether there is a failure in the image display apparatus that can be installed externally.

Meanwhile, when the detected first current deviates from a first allowable range, a failure signal of the timing controller or the panel is transmitted to the server, so that, in a remote location, it is possible to easily determine whether there is a failure in the image display apparatus that can be installed externally.

Meanwhile, by a second current detector, which detects a second current based on the second DC power applied to the second interface, it is possible to easily determine whether there is a failure in the backlight.

Meanwhile, when the detected second current deviates from a second allowable range, a backlight failure signal is transmitted to the server, so that, in a remote location, it is possible to easily determine whether there is a failure in the image display apparatus that can be installed externally.

Meanwhile, by a third current detector, which is disposed between the first interface and the power supply device, and detects a third current based on the first DC power outputted from the first interface, the controller can easily determine whether the panel is failed.

Meanwhile, the controller controls a first pattern image to be displayed during a first period, controls, when the first pattern image is displayed, a second pattern image during a second period, when the detected first current deviates from the first allowable range and is equal to or less than a first minimum level, and can simply determine that the panel is failed, when the detected second current is equal to or less than a second minimum level, when the second pattern image is displayed.

In particular, when the second pattern image is a plurality of sequential pattern images, a failure position of the panel can be determined, based on the sequential pattern image and the detected first current.

In another aspect, there is provided an image display apparatus, including: a controller to output an image signal and a first DC power; and a display to receive the image signal, the first DC power, and a second DC power, and display a certain image based on the image signal, wherein the display includes: a first interface to receive the image signal and the first DC power from the controller; a timing controller to output a data driving signal and a gate driving signal based on the image signal; a panel to display an image according to the data driving signal and the gate driving signal; a second interface to receive a second DC power; a data driver to output a data signal to the panel based on the second DC power; and a first current detector to detect a first current based on the first DC power applied to the first interface, wherein the controller determines that the timing controller or the panel is failed, when the detected first current deviates from a first allowable range. Accordingly, it is possible to easily determine whether there is a failure in the image display apparatus that can be installed externally.

Meanwhile, when the detected first current deviates from a first allowable range, a failure signal of the timing controller or the panel is transmitted to the server, so that, in a remote location, it is possible to easily determine whether there is a failure in the image display apparatus that can be installed externally.

Meanwhile, by a second current detector which detects a second current based on the second DC power applied to the second interface, it is possible to easily determine whether there is a failure in the panel.

Meanwhile, the controller controls a first pattern image to be displayed during a first period, controls, when the first pattern image is displayed, a second pattern image during a second period, when the detected first current deviates from the first allowable range and is equal to or less than a first minimum level, and can simply determine that the panel 210 is failed, when the detected second current is equal to or less than a second minimum level, when the second pattern image is displayed.

In particular, when the second pattern image is a plurality of sequential pattern images, it is possible to determine a failure position of the panel, based on the sequential pattern image and the detected first current.

MODE FOR INVENTION

Hereinafter, preferred embodiments of the present disclosure will be described with reference to the accompanying drawings. With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
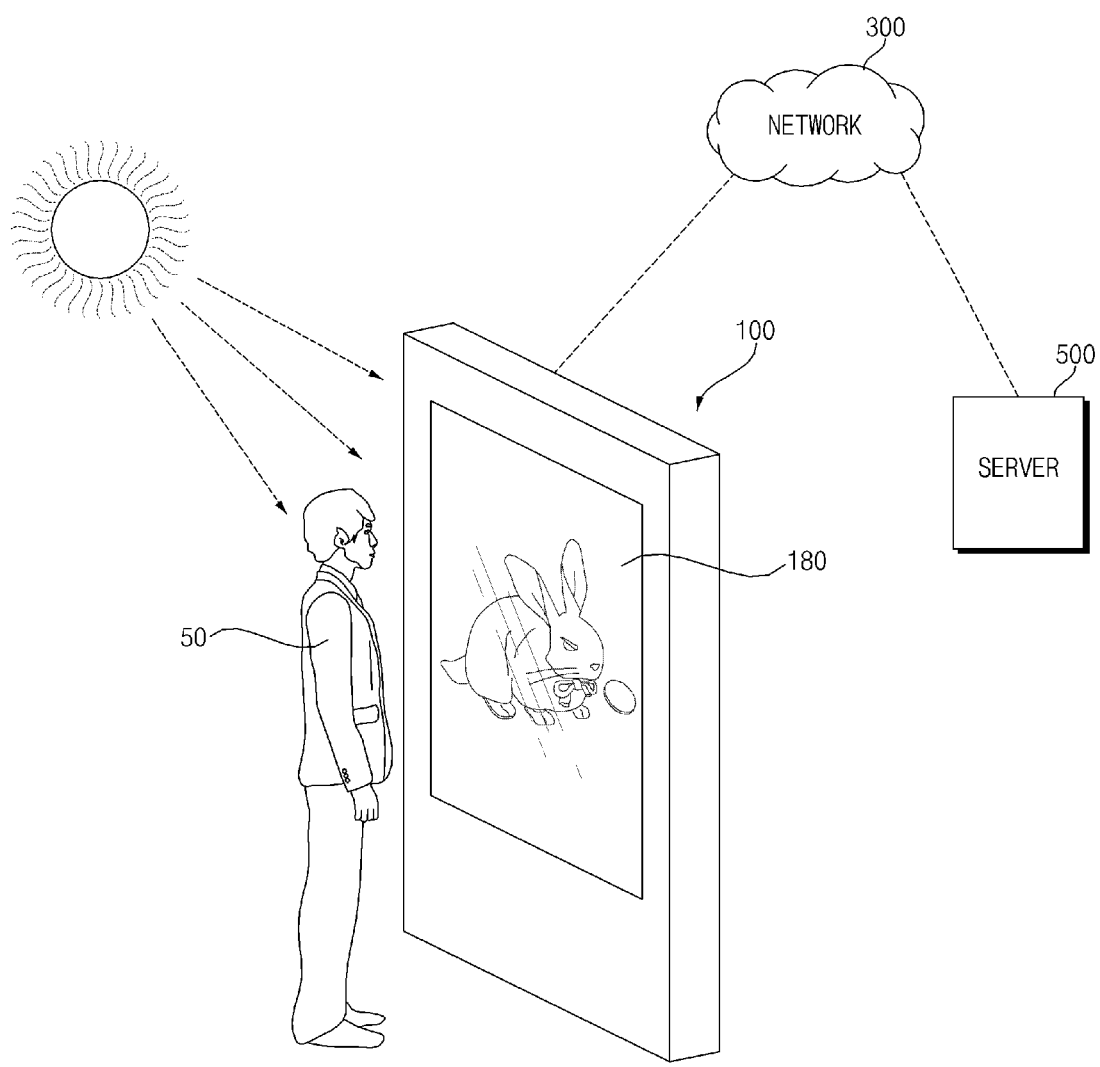
FIG. 1 is a diagram illustrating an image display system including an image display apparatus according to an embodiment of the present disclosure.

FIG. 1 is a diagram illustrating an image display system including an image display apparatus according to an embodiment of the present disclosure.

Referring to FIG. 1, an image display apparatus 100 may be installed in an external public place, and the like.

For example, the image display apparatus 100 may be installed in public facilities such as in-vehicles, terminals, train stations, and airports in order to provide information such as advertisements, news, and announcements. In addition, the image display apparatus 100 may be placed around a show window in stores, such as department stores, shopping malls, large marts, for advertisements of certain goods.

The image display apparatus 100 may include a display 180 disposed inside a casing.

Meanwhile, as shown in the drawing, a user 50 may watch an image displayed on the image display apparatus 100.

Meanwhile, as shown in the drawing, when the image display apparatus 100 is disposed outdoors, in the image display apparatus 100, when a failure occurs, there is a problem that an administrator who is remotely located can not quickly determine whether the image display apparatus 100 is failed.

Accordingly, the present disclosure proposes a method of simply determining whether there is a failure in an image display apparatus that can be installed externally.

In addition, the present disclosure proposes a method of determining a fault location in the image display apparatus 100 that can be installed externally.

To this end, the image display apparatus 100 according to an embodiment of the present disclosure includes a controller 170 for outputting an image signal Vd, a first DC power V1, and a second DC power V2, and a display 180 which receives the image signal Vd, the first DC power V1, and the second DC power V2, and displays a certain image based on the image signal Vd. The display 180 includes a first interface 230 for receiving the image signal Vd and the first DC power V1 from the controller 170, a timing controller 232 for outputting a data driving signal and a gate driving signal based on the image signal Vd, a panel 210 displaying an image according to the data driving signal and the gate driving signal, a second interface 231 for receiving a second DC power V2 from the controller 170, a backlight 250 for outputting light to the panel 210 based on the second DC power V2, and a first current detector CD1 for detecting a first current based on the first DC power V1 applied to the first interface 230. If the detected first current deviates from a first allowable range, the controller 170 determines that the timing controller 232 or the panel 210 is failed. Accordingly, it is possible to easily determine whether there is a failure in the image display apparatus 100 that can be installed externally.

Meanwhile, when the detected first current deviates from the first allowable range, the failure signal of the timing controller 232 or the panel is transmitted to a server 500 via a network 300, thereby simply determining, in a remote location, whether there is a failure in the image display apparatus 100 that can be installed externally.

In particular, by separating a first space in the front surface of the display 180 and a second space in the rear surface of the display 180, the temperature of the first space is reduced by heat exchange with the second space. With respect to the temperature of the second space, a heat exchange with the outside is performed through a heat exchanger 110a disposed in the rear surface of a case 101, thereby achieving heat exchange and temperature reduction gradually. Therefore, it is possible to effectively cool the temperature inside the image display apparatus 100 that can be installed externally.

The image display apparatus 100 includes a controller 170 for outputting an image signal Vd, a first DC power V1, and a second DC power V2, and a display 180 for receiving the image signal Vd, the first DC power V1, and the second DC power V2, and displaying a certain image based on the image signal Vd. The display 180 includes a first interface 230 for receiving the image signal Vd and the first DC power V1 from the controller 170, a timing controller 232 for outputting a data driving signal and a gate driving signal based on the image signal Vd, a panel 210 displaying an image according to the data driving signal and the gate driving signal, a second interface 231 for receiving the second DC power V2 from the controller 170, a backlight 250 for outputting light to the panel 210 based on the second DC power V2, and a first current detector CD1 for detecting a first current based on the first DC power V1 applied to the first interface 230. When the detected first current deviates from a first allowable range, the controller 170 determines that the timing controller 232 or the panel 210 is failed. Accordingly, it is possible to easily determine whether there is a failure in the image display apparatus 100 that can be installed externally.

Meanwhile, when the detected first current deviates from the first allowable range, the failure signal of the timing controller 232 or the panel is transmitted to the server 500, thereby simply determining, in a remote location, whether there is a failure in the image display apparatus 100 that can be installed externally.

Figure 2:
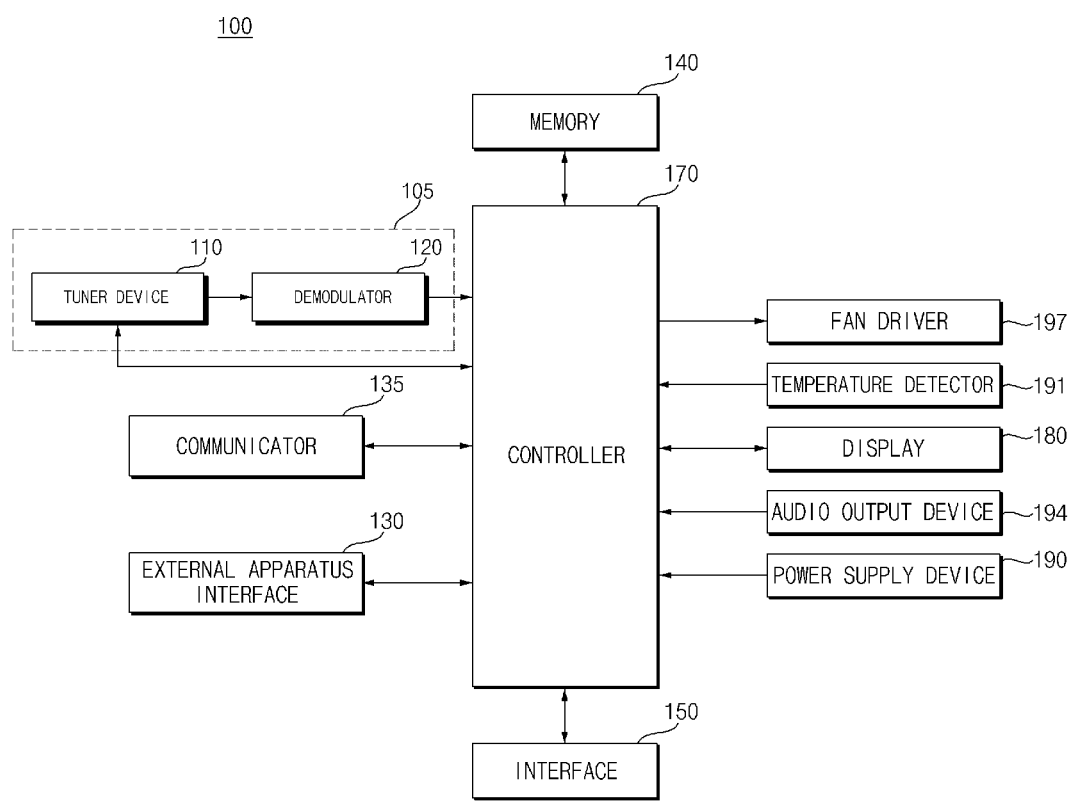
FIG. 2 is an example of an internal block diagram of the image display apparatus of FIG. 1.

FIG. 2 is an example of an internal block diagram of the image display apparatus of FIG. 1.

Referring to the drawing, the image display apparatus 100 may include an external apparatus interface 130, a communicator 135, a memory 140, a controller 170, a display 180, a power supply device 190, and an audio output device 194, a temperature detector 191, a fan driver 197, and the like.

The external apparatus interface 130 may transmit/receive data with a connected external apparatus (not shown). To this end, the external apparatus interface 130 may include an A/V input/output unit (not shown) or a data input/output unit (not shown).

For example, the external apparatus interface 130 may include an HDMI terminal, an RGB terminal, a component terminal, a USB terminal, a micro SD terminal, and the like.

The communicator 135 provides an interface for connecting the image display apparatus 100 to a wired/wireless network including an internet network. For example, the communicator 135 may transmit and receive content or data provided by the Internet, a content provider, or a network operator through a network.

The memory 140 may store a program for processing and controlling each signal in the controller 170, or may store a signal processed image, voice, or data driving signal.

In addition, the memory 140 may serve to temporarily store an image, voice, or data driving signal inputted to the external apparatus interface 130.

Meanwhile, the display 180 may include various display panels, such as an LCD and an OLED, and may display a certain image through a display panel.

A user input interface 150 transmits a signal inputted by a user to the controller 170 or transmits a signal from the controller 170 to the user.

To this end, the user input interface 150 may include a local key including a power key, a touch panel for inputting user information, and the like.

The controller 170 may perform an overall control operation of the image display apparatus 100. In detail, the operation of each unit in the image display apparatus 100 may be controlled.

The controller 170 may control to output a video image stored in the memory 140 or a video image received from an external apparatus through the communicator 135, as an output image.

In particular, the controller 170 may control the display 180 to output a certain image. In detail, the R, G, and B signals corresponding to the video image to be displayed may be outputted to the display 180. Accordingly, the display 180 may display a certain image.

The power supply device 190 may receive an external power or an internal power under the control of the controller 170 to supply power for operation of each component.

The power supply device 190 supplies a corresponding power throughout the image display apparatus 100. In particular, power may be supplied to the controller 170, which may be implemented in the form of a System On Chip (SOC), the display 180 for displaying an image, and the audio output device 194 for audio output.

The temperature detector 191 may detect a temperature in the display 180 or the ambient temperature.

The temperature detected by the temperature detector 191 may be inputted to the controller 170, and the controller 170 may control an operation of the fan driver 197 based on the detected temperature.

For example, when the detected temperature is greater than or equal to a certain temperature, the controller 170 may operate the fan driver 197 to decrease the temperature inside the image display apparatus 100.

The fan driver 197 may drive at least one fan module disposed inside the image display apparatus 100.

Figure 3:
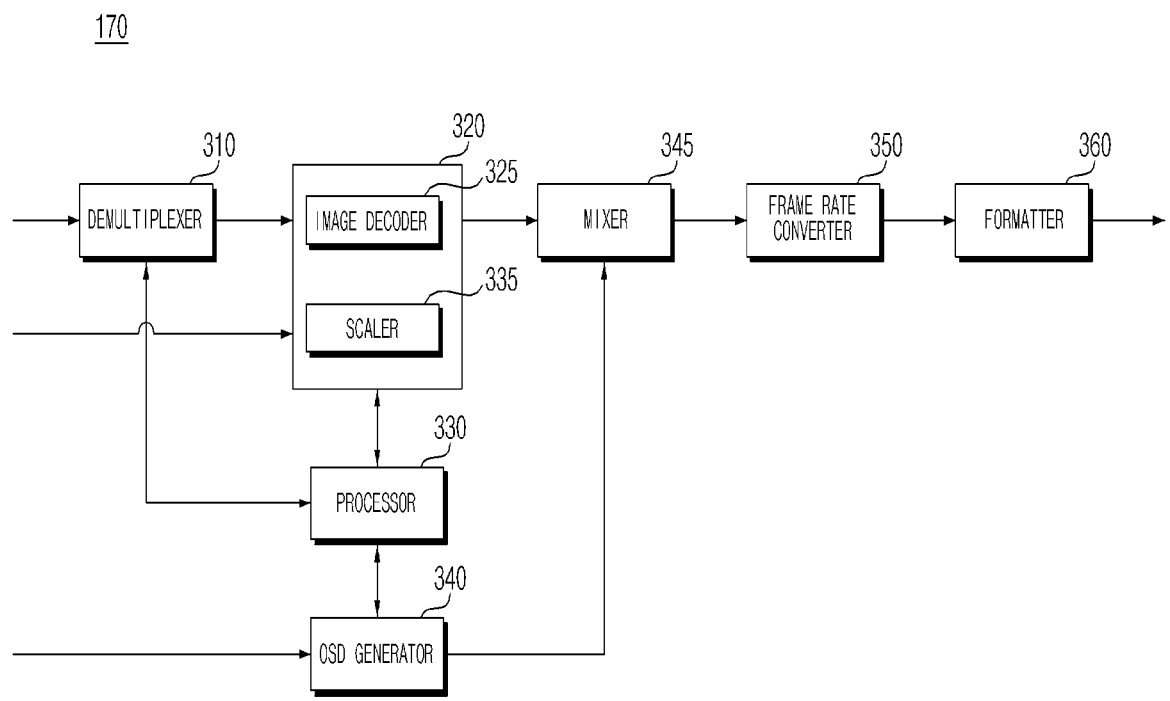
FIG. 3 is an internal block diagram of a controller of FIG. 2.

FIG. 3 is an internal block diagram of a controller of FIG. 2.

Referring to the drawing, the controller 170 according to an embodiment of the present disclosure may include a demultiplexer 310, an image processor 320, a processor 330, an OSD generator 340, a mixer 345, a frame rate converter 350, and formatter 360. In addition, the controller 170 may further include an audio processor (not shown) and a data processor (not shown).

The demultiplexer 310 demultiplexes an input stream. For example, when an MPEG-2 TS is inputted, the MPEG-2 TS may be demultiplexed, and separated into image, voice, and data driving signal, respectively. Here, the stream signal inputted to the demultiplexer 310 may be a stream signal outputted from a tuner device 110, a demodulator 120, or the external apparatus interface 130.

The image processor 320 may perform image processing of the demultiplexed image signal. To this end, the image processor 320 may include an image decoder 225 and a scaler 235.

The image decoder 225 decodes the demultiplexed image signal, and the scaler 235 performs scaling so as to output the resolution of the decoded image signal from the display 180.

The image decoder 225 may include a decoder of various standards.

Meanwhile, the image signal decoded by the image processor 320 may be classified into a case in which only a 2D image signal exists, a case in which a 2D image signal and a 3D image signal are mixed, and a case in which only a 3D image signal exists.

For example, an external image signal inputted from an external device 190 or a broadcast image signal of a broadcast signal received by the tuner device 110 may be classified into a case in which only a 2D image signal exists, a case in which a 2D image signal and a 3D image signal are mixed, and a case in which only a 3D image signal exists. Accordingly, the signal is processed by the controller 170, in particular, by the image processor 320, etc, so that the 2D image signal, the mixed signal of 2D image signal and 3D image signal, and the 3D image signal may be outputted.

Meanwhile, the image signal decoded by the image processor 320 may be a 3D image signal having various formats. For example, the image signal may be a 3D image signal formed of a color image and a depth image, or may be a 3D image signal formed of multiple-view point image signal. The multi-view point image signal may include, for example, a left eye image signal and a right eye image signal.

Here, the format of the 3D image signal may be a side by side format in which the left eye image signal L and the right eye image signal R are disposed in left and right sides, a top/down format vertically disposed, a frame sequential format disposed in a form of time division, an interlaced format that mixes the left eye image signal and the right eye image signal line by line, and a checker box format that mixes the left eye image signal and the right eye image signal box by box, and the like.

The processor 330 may control overall operations in the image display apparatus 100 or the controller 170. For example, the processor 330 may control the tuner 110 to perform the tuning of an RF broadcast corresponding to a channel selected by a user or a pre-stored channel.

In addition, the processor 330 may control the image display apparatus 100 by a user command inputted through the user input interface 150 or an internal program.

In addition, the processor 330 may perform data transmission control with the communicator 135 or the external apparatus interface 130.

In addition, the processor 330 may control operations of the demultiplexer 310, the image processor 320, the OSD generator 340, and the like, in the controller 170.

The OSD generator 340 generates an OSD signal according to a user input or autonomously. For example, a signal for displaying various types of information on a screen of the display 180 as a graphic or text may be generated, based on a user input signal. The generated OSD signal may include various data such as a user interface screen, various menu screen, widget, and icon of the image display apparatus 100. In addition, the generated OSD signal may include a 2D object or a 3D object.

In addition, the OSD generator 340 may generate a pointer that can be displayed on the display, based on a pointing signal inputted from a remote controller 200. In particular, such a pointer may be generated by a pointing signal processor, and the OSD generator 240 may include such a pointing signal processor (not shown). Obviously, the pointing signal processor (not shown) may not be provided in the OSD generator 240 but be provided separately.

The mixer 345 may mix the OSD signal generated by the OSD generator 340 and the decoded image signal image-processed by the image processor 320. In this case, the OSD signal and the decoded image signal may include at least one of a 2D signal and a 3D signal respectively. The mixed image signal is provided to the frame rate converter 350.

The frame rate converter (FRC) 350 may convert a frame rate of an inputted image. Meanwhile, the frame rate converter 350 can output the image intactly without additional frame rate conversion.

The formatter 360 may arrange the left eye image frame and the right eye image frame of the frame rate-converted 3D image. In addition, a synchronization signal Vsync for opening the left eye glass and the right eye glass of the 3D viewing apparatus (not shown) may be outputted.

Meanwhile, the formatter 360 may receive a mixed signal, i.e., an OSD signal and a decoded image signal, from the mixer 345, and separate the 2D image signal and the 3D image signal.

Meanwhile, the formatter 360 may change the format of the 3D image signal. For example, the format of the 3D image signal may be changed to any one of the various formats described above.

Meanwhile, the formatter 360 may convert the 2D image signal into a 3D image signal. For example, an edge or selectable object may be detected from the 2D image signal according to a 3D image generation algorithm, and an object according to the detected edge or the selectable object may be separated into a 3D image signal and generated. In this case, the generated 3D image signal may be divided into a left eye image signal L and a right eye image signal R, as described above, and may be aligned.

Meanwhile, although not shown in the drawing, a 3D processor (not shown) for processing a 3D (3-dimensional) effect signal may be further disposed, after the formatter 360. The 3D processor (not shown) may process brightness, tint, and color adjustment of an image signal to improve 3D effect. For example, signal processing may be performed to sharpen the image signal of short range, and to blur the image signal of long range. Meanwhile, the function of the 3D processor may be merged into the formatter 360 or merged into the image processor 320.

Meanwhile, an audio processor (not shown) in the controller 170 may perform voice processing of the demultiplexed voice signal. To this end, the audio processor (not shown) may include various decoders.

In addition, the audio processor (not shown) in the controller 170 may process a base, a treble, a volume control, and the like.

A data processor (not shown) in the controller 170 may perform data processing of the demultiplexed data driving signal. For example, when the demultiplexed data driving signal is an encoded data driving signal, it may be decoded. The encoded data driving signal may be electronic program guide (EPG) information including broadcast information such as a start time and an end time of a broadcast program broadcasted in each channel.

Meanwhile, FIG. 3 shows that signals from the OSD generator 340 and the image processor 320 are mixed in the mixer 345 and then 3D-processed in the formatter 360, but the present disclosure is not limited thereto, and the mixer may be located after the formatter. That is, the formatter 360 3D-processes the output of the image processor 320, the OSD generator 340 performs 3D-processing together with OSD generation, and then the mixer 345 can mix each processed 3D signal.

Meanwhile, the block diagram of the controller 170 shown in FIG. 3 is a block diagram for an embodiment of the present disclosure. Each component of the block diagram may be integrated, added, or omitted according to the specification of the controller 170 that is actually implemented.

In particular, the frame rate converter 350 and the formatter 360 may not be provided in the controller 170, but may be separately provided respectively, or may be separately provided as a single module.

Figure 4:
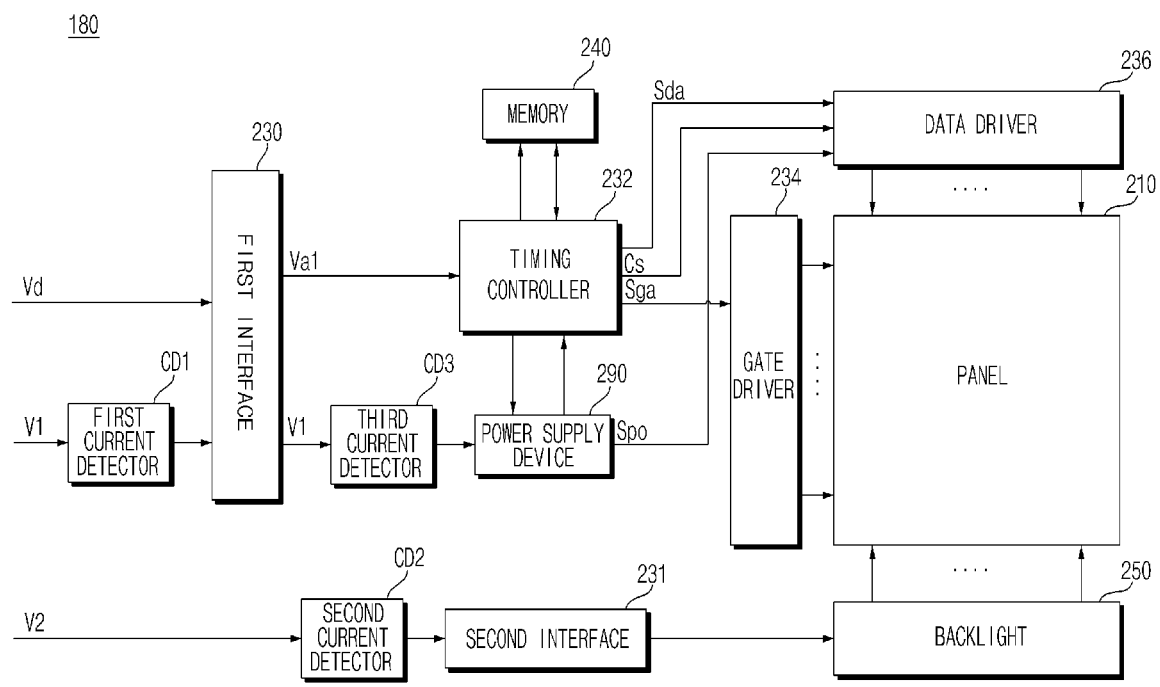
FIG. 4 is an example of an internal block diagram of a display of FIG. 2.

FIG. 4 is an example of an internal block diagram of a display of FIG. 2.

Referring to the drawing, the liquid crystal panel (LCD panel)-based display 180 may include a liquid crystal panel 210, the first interface 230, the second interface 231, the timing controller 232, a gate driver 234, a data driver 236, a memory 240, a backlight 250, a power supply device 290, the first current detector CD1, the second current detector CD2, a third current detector CD3, and the like.

Meanwhile, the controller 170 of FIG. 2 may output the image signal Vd and the first DC power V1 to the display 180.

Meanwhile, the power supply device 190 of FIG. 2 outputs the operation power Vo to the controller 170, and outputs the second DC power V2 to the display 180 separately from the operation power Vo. For example, the operation power Vo may be approximately 24V.

Meanwhile, the controller 170 of FIG. 2 may output the level-converted first DC power V1 to the display 180, based on the operation power Vo from the power supply device 190.

The display 180 may receive the image signal Vd, the first DC power V1, and the second DC power V2, and display a certain image, based on the image signal Vd.

Meanwhile, the first interface 230 in the display 180 may receive the image signal Vd and the first DC power V1 from the controller 170.

Here, the first DC power V1 may be used for the operation of the power supply device 290 and the timing controller 232 in the display 180. For example, the first DC power V1 may be approximately 12V.

The first current detector CD1 may detect a first current based on the first DC power V1 applied to the first interface 230. To this end, the first current detector CD1 may be disposed in the front end of the first interface 230.

The current detected in the first current detector CD1 may be outputted to the controller 170.

Next, the second interface 231 may receive the second DC power V2 from the external power supply device 190. Meanwhile, the second DC power V2 may be inputted to the backlight 250 inside the display 180. For example, the second DC power V2 may be approximately 24V.

The second current detector CD2 may detect a second current based on the second DC power V2 applied to the second interface 231. To this end, the second current detector CD2 may be disposed in the front end of the second interface 231.

The current detected in the second current detector CD2 may be outputted to the controller 170.

The timing controller 232 may output the data driving signal Sda and the gate driving signal Sga, based on the image signal Vd.

For example, when the first interface 230 converts the inputted image signal Vd and outputs the converted image signal va1, the timing controller 232 may output the data driving signal Sda and the gate driving signal Sga, based on the converted image signal va1.

The timing controller 232 may further receive a control signal, a vertical synchronization signal Vsync, and the like from the controller 170, in addition to the video signal Vd.

In addition, the timing controller 232 may output the gate driving signal Sga for the operation of the gate driver 234, and the data driving signal Sda for the operation of the data driver 236, based on a control signal, a vertical synchronization signal Vsync, and the like, in addition to the video signal Vd.

Meanwhile, the timing controller 232 may further output the control signal Cs to the gate driver 234.

The gate driver 234 and the data driver 236 supply a scan signal and an image signal to the liquid crystal panel 210 through the gate line GL and the data line DL respectively, according to the gate driving signal Sga and the data driving signal Sda from the timing controller 232. Accordingly, the liquid crystal panel 210 displays a certain image.

Meanwhile, in order to display an image, the liquid crystal panel 210 has a plurality of gate lines GL and data lines DL that are disposed to intersect in a matrix form. The liquid crystal panel 210 includes a first substrate where a thin film transistor and a pixel electrode connected thereto are formed in the intersecting area, a second substrate provided with a common electrode, and a liquid crystal layer formed between the first substrate and the second substrate.

The backlight 250 may supply light to the liquid crystal panel 210. To this end, the backlight 250 may include a plurality of light sources (not shown) that are a light source, a scan driver (not shown) that controls scanning driving of the light source (not shown), and a light source driver (not shown) that turns on/off the light source (not shown).

Meanwhile, the backlight 250 may output light to the panel 210, based on the second DC power V2 from the second interface 231.

Meanwhile, the third current detector CD3 is disposed between the first interface 230 and the power supply device 190, and may detect a third current based on the first DC power V1 outputted from the first interface 230. To this end, the third current detector CD3 may be disposed in the rear end of the first interface 230.

Meanwhile, the current detected by the third current detector CD3 may be outputted to the controller 170.

Meanwhile, when the detected first current deviates from the first allowable range, the controller 170 may determine that the timing controller 232 or the panel 210 is failed. Accordingly, it is possible to easily determine whether there is a failure in the image display apparatus 100 that can be installed externally.

Meanwhile, the controller 170 may control the failure signal of the timing controller 232 or the panel to be transmitted to the server 500, when the detected first current deviates from the first allowable range. Accordingly, it is possible to easily determine, in a remote location, whether there is a failure in the image display apparatus 100 that can be installed externally.

In particular, the controller 170 may control the failure signal of the timing controller 232 or the panel to be transmitted to the server 500, when the detected first current is less than or equal to a minimum level. Accordingly, it is possible to easily determine, in a remote location, whether there is a failure of the timing controller 232 or the panel in the image display apparatus 100 that can be installed externally.

Meanwhile, the controller 170 may determine that there is a failure in the backlight 250, when the detected second current deviates from a second allowable range. That is, it is possible to easily determine whether there is a failure in the backlight 250.

Meanwhile, the controller 170 may control to transmit a backlight failure signal to the server 500, when the detected second current deviates from the second allowable range. Accordingly, it is possible to easily determine, in a remote location, whether there is a failure in the backlight 250 in the image display apparatus 100 that can be installed externally.

Meanwhile, when the detected first current deviates from the first allowable range and the detected second current does not deviate from the second allowable range, the controller 170 may control to transmit the failure signal of the timing controller 232 or the panel to the server 500.

Meanwhile, the controller 170 may determine that there is a failure in the panel 210, when the detected third current deviates from the third allowable range. Accordingly, it is possible to easily determine whether there is a failure in the panel in the image display apparatus 100 that can be installed externally.

Meanwhile, when the detected first current deviates from the first allowable range and the third current does not deviate from the third allowable range, the controller 170 may determine that there is a failure in the timing controller 232.

Meanwhile, the controller 170 may control to transmit a panel failure signal to the server 500, when the detected third current is less than or equal to a minimum level. Accordingly, it is possible to easily determine, in a remote location, whether there is a failure of the panel in the image display apparatus 100 that can be installed externally.

Figure 5:
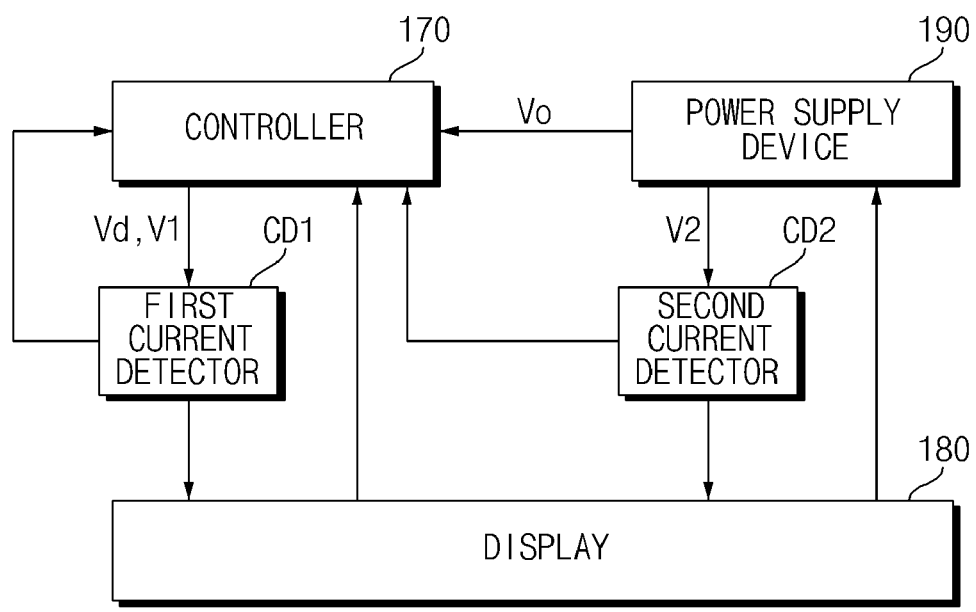
FIG. 5 is a diagram illustrating an operation of the display, the controller, and a power supply device of FIG. 2.

FIG. 5 is a diagram illustrating an operation of the display, the controller, and a power supply device of FIG. 2.

Referring to the drawing, the power supply device 190 outputs the operation power Vo to the controller 170, and outputs the second DC power V2 to the display 180, separately from the operation power Vo. For example, the operation power Vo may be approximately 24V.

Meanwhile, the controller 170 may output the level-converted first DC power V1 to the display 180, based on the operation power Vo from the power supply 190. For example, the first DC power V1 may be approximately 12V.

In addition, the controller 170 may output the image signal Vd that is signal-processed therein to the display 180.

Meanwhile, unlike FIG. 4, the first current detector CD1 and the second current detector CD2 can be disposed outside the display 180.

As shown in the drawing, the first current detector CD1 may be disposed between the controller 170 and the display 180, and the second current detector CD2 may be disposed between the power supply device 190 and the display 180.

Meanwhile, the first current detector CD1 may detect a first current based on the first DC power V1 applied to the first interface 230. In the first current detector CD1, the detected current may be outputted to the controller 170.

Meanwhile, the second current detector CD2 may detect a second current based on the second DC power V2 applied to the second interface 231. In the second current detector CD2, the detected current may be outputted to the controller 170.

Figure 6:
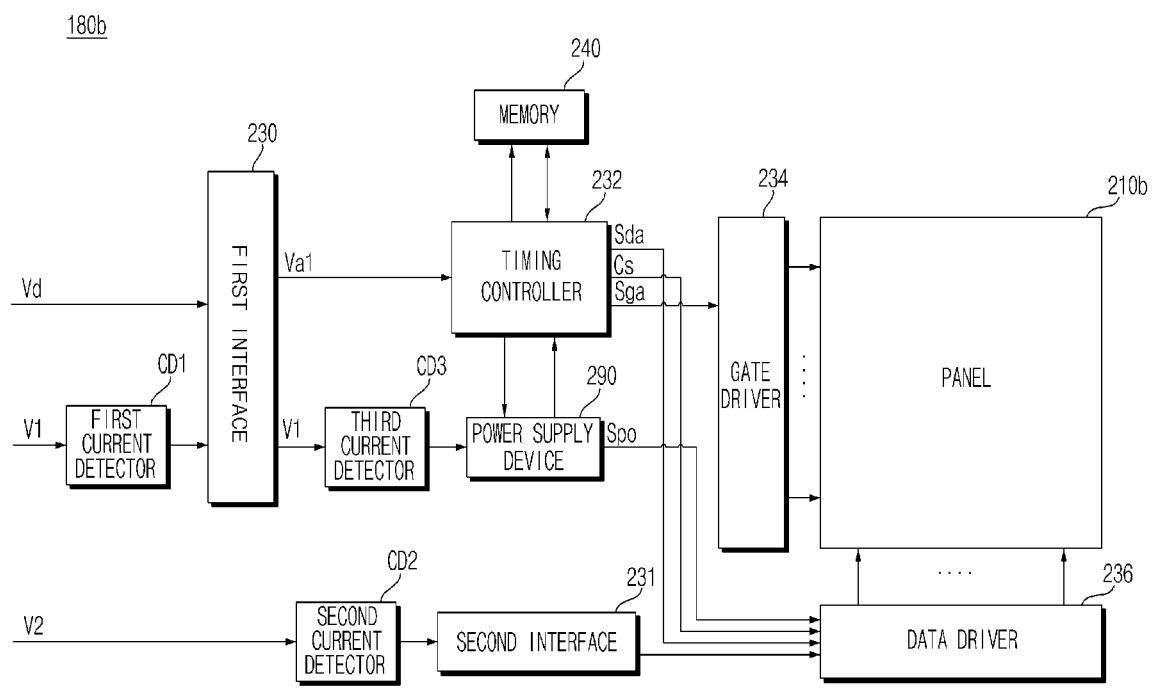
FIG. 6 is another example of an internal block diagram of the display of FIG. 2.

FIG. 6 is another example of an internal block diagram of the display of FIG. 2.

A display 180b of FIG. 6 is similar to the display 180 of FIG. 4, but has a difference in that the panel is an organic light emitting diode (OLED) panel 210b instead of the liquid crystal panel 210.

Referring to the drawing, an organic light emitting diode (OLED) panel-based display 180b may include an organic light emitting diode panel 210b, a first interface 230, a second interface 231, a timing controller 232, a gate driver 234, a data driver 236, a memory 240, a backlight 250, a power supply device 290, a first current detector CD1, a second current detector CD2, a third current detector CD3, and the like.

The display 180b may receive the image signal Vd, the first DC power V1, and the second DC power V2, and display a certain image, based on the image signal Vd.

Meanwhile, the first interface 230 in the display 180b may receive the image signal Vd and the first DC power V1 from the controller 170.

Here, the first DC power V1 may be used for the operation of the power supply device 290 and the timing controller 232 in the display 180b.

The first current detector CD1 may detect a first current based on the first DC power V1 applied to the first interface 230. To this end, the first current detector CD1 may be disposed in the front end of the first interface 230.

The current detected in the first current detector CD1 may be outputted to the controller 170.

Next, the second interface 231 may receive the second DC power V2 from the external power supply device 190. Meanwhile, the second DC power V2 may be inputted to the data driver 236 inside the display 180b.

The second current detector CD2 may detect a second current based on the second DC power V2 applied to the second interface 231. To this end, the second current detector CD2 may be disposed in the front end of the second interface 231.

The current detected in the second current detector CD2 may be outputted to the controller 170.

The timing controller 232 may output the data driving signal Sda and the gate driving signal Sga, based on the image signal Vd.

For example, when the first interface 230 converts the inputted image signal Vd and outputs the converted image signal va1, the timing controller 232 may output the data driving signal Sda and the gate driving signal Sga, based on the converted image signal va1.

The timing controller 232 may further receive a control signal, a vertical synchronization signal Vsync, and the like from the controller 170, in addition to the video signal Vd.

In addition, the timing controller 232 may output the gate driving signal Sga for the operation of the gate driver 234, and the data driving signal Sda for the operation of the data driver 236, based on the control signal, the vertical synchronization signal Vsync, and the like, in addition to the video signal Vd.

Meanwhile, the timing controller 232 may further output the control signal Cs to the gate driver 234.

The gate driver 234 and the data driver 236 supply a scan signal and an image signal to the organic light emitting diode panel 210b through the gate line GL and the data line DL respectively, according to the gate driving signal Sga and the data driving signal Sda from the timing controller 232. Accordingly, the organic light emitting diode panel 210b displays a certain image.

Meanwhile, the organic light emitting diode panel 210b may include an organic light emitting layer, and has a plurality of gate lines GL and data lines DL that are disposed to intersect in a matrix form in order to display an image.

Meanwhile, the data driver 236 may output a data signal to the organic light emitting diode panel 210*b*, based on the second DC power V2 from the second interface 231.

Meanwhile, the third current detector CD3 is disposed between the first interface 230 and the power supply device 190, and may detect a third current based on the first DC power V1 outputted from the first interface 230. To this end, the third current detector CD3 may be disposed in the rear end of the first interface 230.

Meanwhile, the current detected by the third current detector CD3 may be outputted to the controller 170.

Meanwhile, when the detected first current deviates from the first allowable range, the controller 170 may determine that the timing controller 232 or the panel 210 is failed. Accordingly, it is possible to easily determine whether there is a failure in the image display apparatus 100 that can be installed externally.

Meanwhile, the controller 170 may control the failure signal of the timing controller 232 or the panel to be transmitted to the server 500, when the detected first current deviates from the first allowable range. Accordingly, it is possible to easily determine, in a remote location, whether there is a failure in the image display apparatus 100 that can be installed externally.

In particular, the controller 170 may control the failure signal of the timing controller 232 or the panel to be transmitted to the server 500, when the detected first current is less than or equal to a minimum level. Accordingly, it is possible to easily determine, in a remote location, whether there is a failure of the timing controller 232 or the panel in the image display apparatus 100 that can be installed externally.

Meanwhile, the controller 170 may determine that there is a failure in the panel 210*b*, when the detected second current deviates from a second allowable range. That is, it is possible to easily determine whether there is a failure in the panel 210*b*.

Meanwhile, the controller 170 may control to transmit a panel failure signal to the server 500, when the detected second current deviates from the second allowable range. Accordingly, it is possible to easily determine, in a remote location, whether there is a failure in the panel 210*b* in the image display apparatus 100 that can be installed externally.

Meanwhile, when the detected first current deviates from the first allowable range and the detected second current does not deviate from the second allowable range, the controller 170 may control to transmit the failure signal of the timing controller to the server 500.

Meanwhile, the controller 170 may determine that there is a failure in the panel 210*b*, when the detected third current deviates from the third allowable range. Accordingly, it is possible to easily determine whether there is a failure of the panel in the image display apparatus 100 that can be installed externally.

Meanwhile, when the detected first current deviates from the first allowable range and the third current does not deviate from the third allowable range, the controller 170 may determine that there is a failure in the timing controller.

Meanwhile, the controller 170 may control to transmit a panel failure signal to the server 500, when the detected third current is less than or equal to a minimum level. Accordingly, it is possible to easily determine, in a remote location, whether there is a failure of the panel in the image display apparatus 100 that can be installed externally.

In the following description, the display 180 of the image display apparatus 100 of FIG. 4 will be described.

Figure 7:
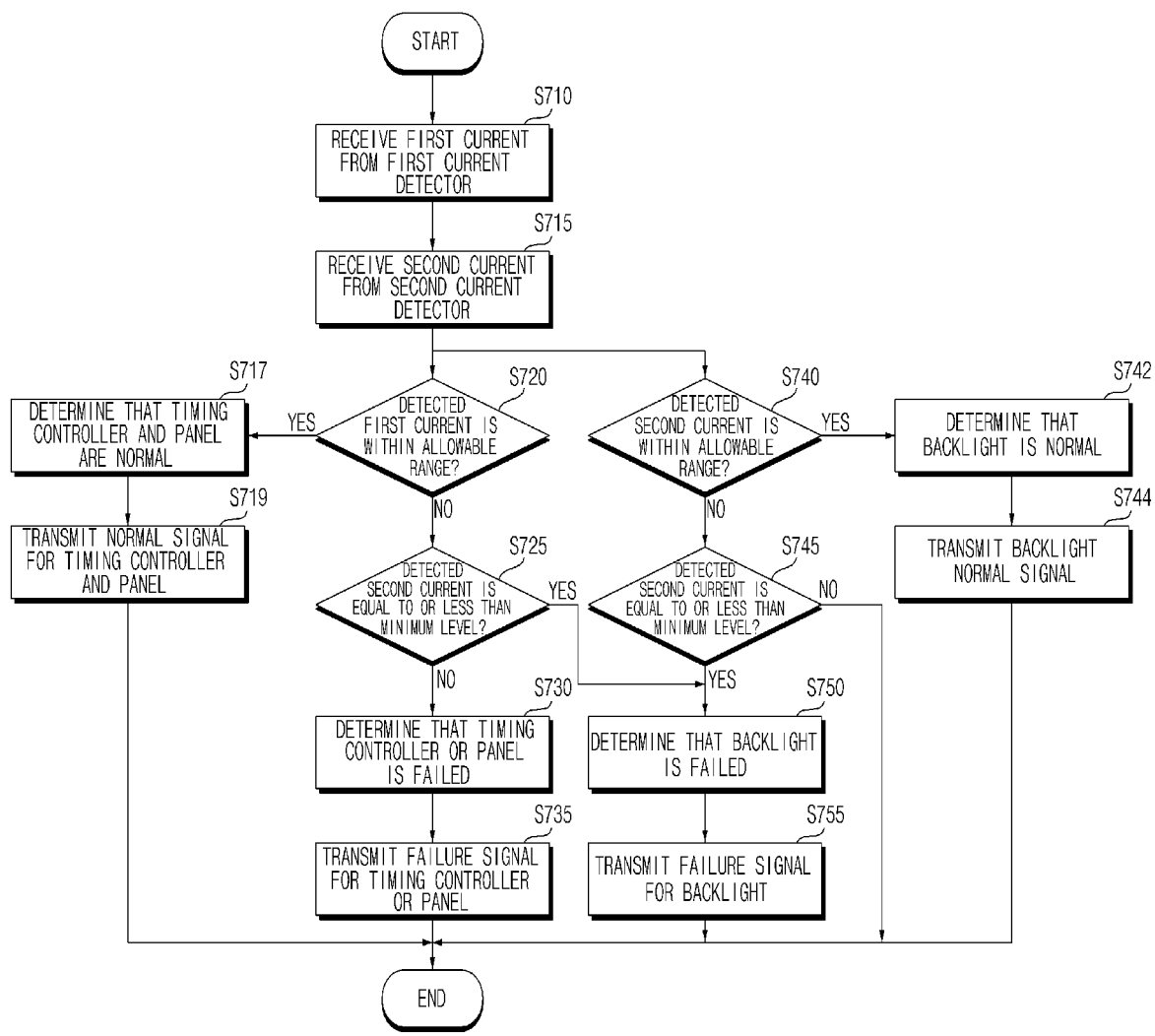
FIG. 7 is a flowchart for explaining an operation of an image display apparatus according to an embodiment of the present disclosure.
Figure 8A:
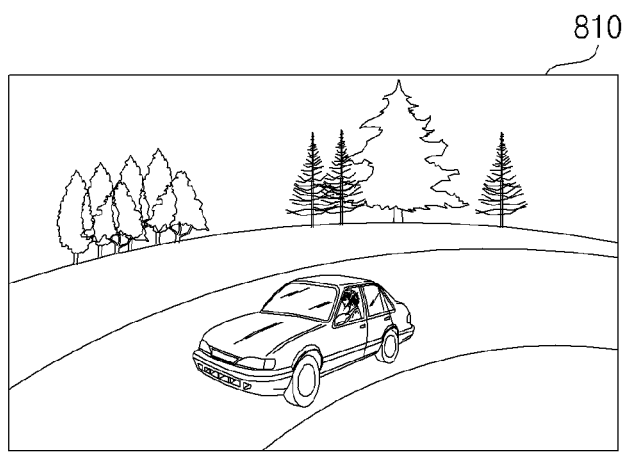
FIGS. 8A to 8B are diagrams for explaining the operation of FIG. 7.
Figure 8A:
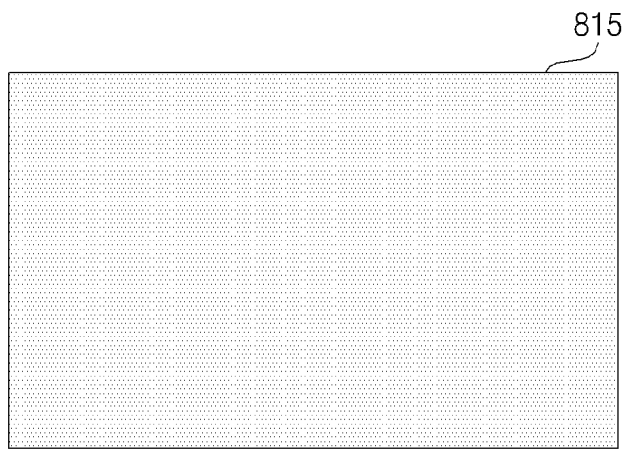
Figure 8B:
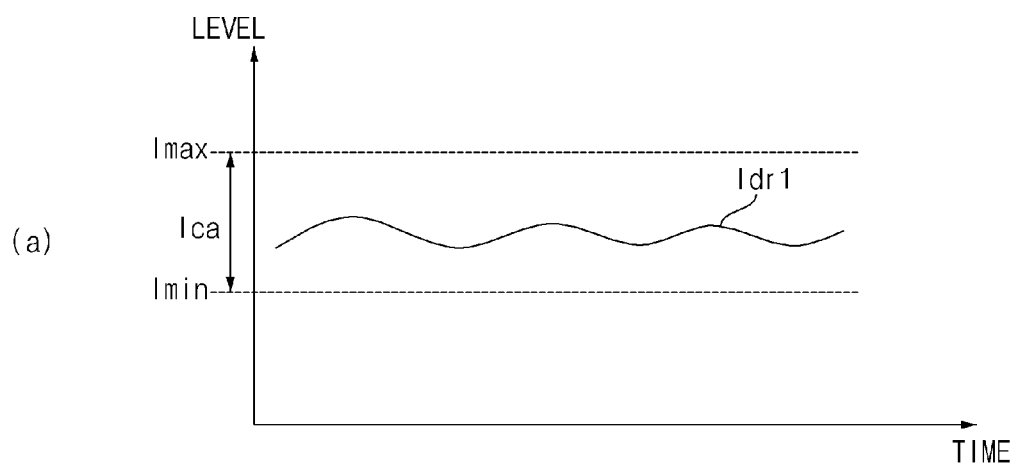
Figure 8B:
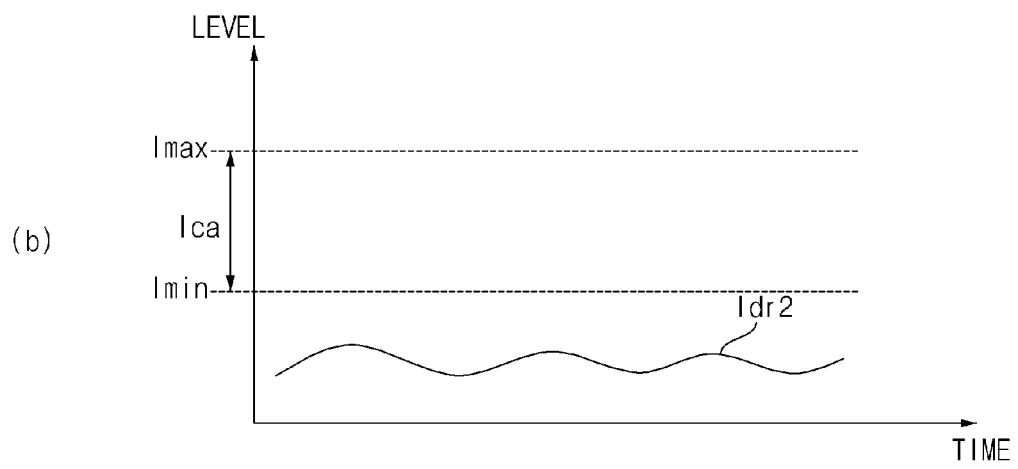

FIG. 7 is a flowchart for explaining an operation of an image display apparatus according to an embodiment of the present disclosure, and FIGS. 8A to 8B are diagrams for explaining the operation of FIG. 7.

Referring to the drawing, the controller 170 of the image display apparatus 100 may receive a first current from the first current detector CD1 (S710).

Next, the controller 170 of the image display apparatus 100 may receive a second current from the second current detector CD2 (S715).

Next, the controller 170 of the image display apparatus 100 determines whether the detected first current is within the first allowable range (S720), and determines that the timing controller 232 and the panel 210 are normal when it is within the first allowable range (S717).

In addition, the controller 170 of the image display apparatus 100 may control to transmit a normal signal for the timing controller 232 and the panel 210 to the server 500 (S719). Accordingly, it is possible to easily determine, in a remote location, whether the timing controller 232 and the panel 210 operate normally.

Meanwhile, at step 720 (S720), when the detected first current deviates from the first allowable range, the controller 170 of the image display apparatus 100 determines whether the detected second current is equal to or less than the minimum level (S725).

In addition, when the detected second current exceeds the minimum level, the controller 170 of the image display apparatus 100 may determine that the timing controller 232 or the panel 210 is failed (S730).

In addition, the controller 170 of the image display apparatus 100 may control to transmit a failure signal for the timing controller 232 or the panel 210 to the server 500 (S735). Accordingly, it is possible to easily determine, in a remote location, whether the timing controller 232 or the panel 210 is failed.

Meanwhile, at step 735 (S735), if the detected second current is less than or equal to the minimum level, step 750 (S750) and step 765 (S765) may be performed.

That is, when the detected second current is less than or equal to the minimum level, the controller 170 of the image display apparatus 100 may determine that the backlight 250 is failed (S750).

In addition, the controller 170 of the image display apparatus 100 may control to transmit a failure signal for the backlight 250 to the server 500 (S750). Accordingly, it is possible to easily determine, in a remote location, whether the backlight 250 is failed.

Meanwhile, after step 715 (S715), the controller 170 of the image display apparatus 100 determines whether the detected second current is within a second allowable range (S740), and determines that the backlight 250 is normal, when it is within the second allowable range (S742).

In addition, the controller 170 of the image display apparatus 100 may control to transmit the normal signal for the backlight 250 to the server 500 (S744). Accordingly, it is possible to easily determine, in a remote location, whether the backlight 250 is normally operated.

Meanwhile, at step 740 (S740), when the detected second current deviates from the second allowable range, the controller 170 of the image display apparatus 100 determines whether the detected second current is equal to or less than the minimum level. (S745).

In addition, if the detected second current is less than or equal to the minimum level, the controller 170 of the image display apparatus 100 may determine that the backlight is failed (S750).

In addition, the controller 170 of the image display apparatus 100 may control to transmit a failure signal for the backlight 250 to the server 500 (S755). Accordingly, it is possible to easily determine, in a remote location, whether the backlight 250 is failed.

Meanwhile, FIG. 8A(a) illustrates that a certain image 810 is displayed on the panel 210 of the display 180.

Meanwhile, FIG. 8A(b) illustrates that the panel 210 is turned off 815 due to a failure of the panel 210.

FIG. 8B(a) illustrates a first current Idr1 detected by the first current detector CD1, and FIG. 8B(b) illustrates a second current Idr2 detected by the second current detector CD2.

Meanwhile, as shown in FIG. 8B(a), when the first current Idr1 detected by the first current detector CD1 is within the first allowable range Ica, the controller 170 of the image display apparatus 100 may determine that the timing controller 232 or the panel 210 is normally operated.

Meanwhile, as shown in FIG. 8B(b), when the second current Idr2 detected by the second current detector CD2 deviates from the second allowable range Ica, and is less than or equal to the minimum level Imin, the controller 170 of the image display apparatus 100 may determine that the backlight 250 is failed.

In addition, the controller 170 of the image display apparatus 100 may control to transmit a failure signal for the backlight 250 to the server 500. Accordingly, it is possible to easily determine, in a remote location, whether the backlight 250 is failed.

Figure 9:
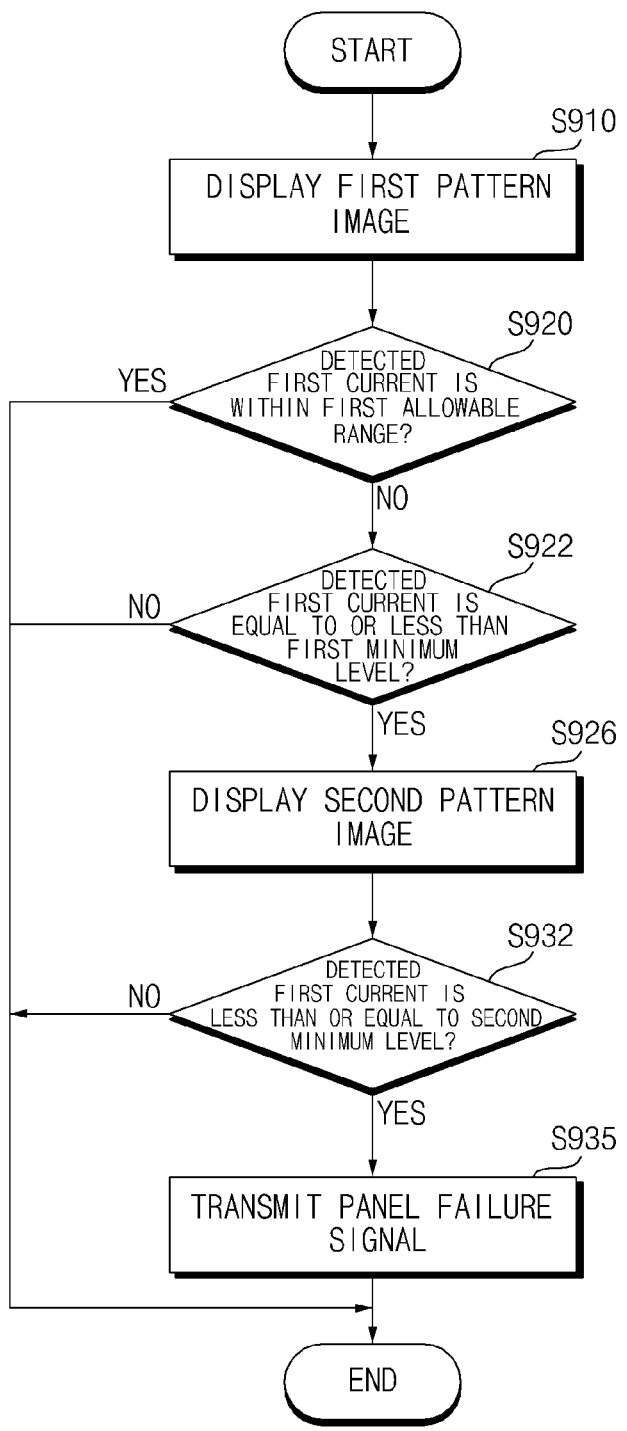
FIG. 9 is a flowchart for explaining an operation of an image display apparatus according to another embodiment of the present disclosure.

FIG. 9 is a flowchart for explaining an operation of an image display apparatus according to another embodiment of the present disclosure, and FIGS. 10A to 17C are diagrams for explaining the operation of FIG. 7 or FIG. 9.

First, the controller 170 of the image display apparatus 100 may control to display a first pattern image during a first period (S910).

For example, the controller 170 of the image display apparatus 100 may control to display a certain image 810 like FIG. 8A(a) as the first pattern image during the first period.

The first pattern image is an image displayed to check whether the image display apparatus 100 is failed, and may be displayed, when the image display apparatus 100 is turned on, or on a cycle, e.g., once a day.

Next, when displaying the first pattern image, the controller 170 of the image display apparatus 100 may determine whether the detected first current is within the first allowable range (S920).

When the detected first current deviates from the first allowable range, the controller 170 of the image display apparatus 100 may determine whether the first current is equal to or less than the first minimum level (S922).

For example, similarly to FIG. 8B(b), it may be determined whether the detected first current is equal to or less than the first minimum level Lmin.

Next, when the detected first current is equal to or less than the first minimum level Lmin, the controller 170 of the image display apparatus 100 may determine that the timing controller 232 or the panel 210 is failed.

Meanwhile, the controller 170 of the image display apparatus 100 may control to display a second pattern image during a second period so as to perform a precise analysis (S926).

For example, the controller 170 may control to display the second pattern image, as shown in FIGS. 10A to 10F.

Meanwhile, the controller 170 of the image display apparatus 100 may determine whether the detected current is less than or equal to a second minimum level when displaying the second pattern image (S932), and if applicable, may determine that the panel 210 is failed.

In addition, the controller 170 of the image display apparatus 100 may control to transmit a panel failure signal to the server 500.

Meanwhile, the second pattern image may include a plurality of sequential pattern images.

Accordingly, the controller 170 of the image display apparatus 100 may determine the failure position of the panel 210, based on the sequential pattern image and the detected first current.

Figure 10A:
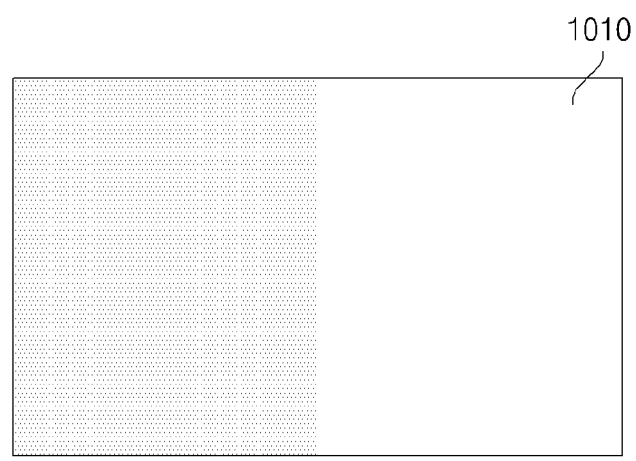
FIGS. 10A to 17C are diagrams for explaining the operation of FIG. 7 or FIG. 9.
Figure 10B:
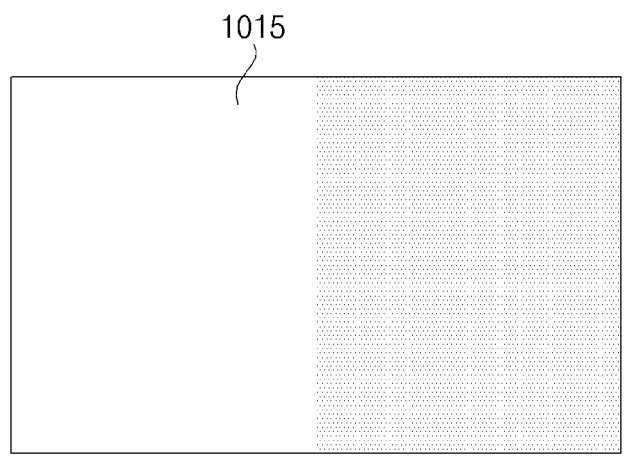

FIG. 10A illustrates that a pattern image 1010 having a black left side and a white right side is displayed, and FIG. 10B illustrates that a pattern image 1015 having a white left side and a black right side.

Figure 11A:
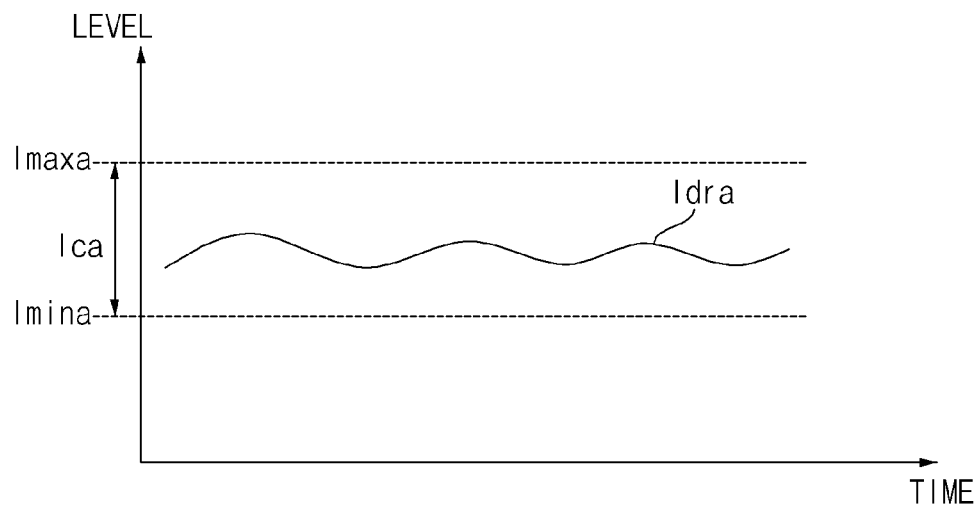
Figure 11B:
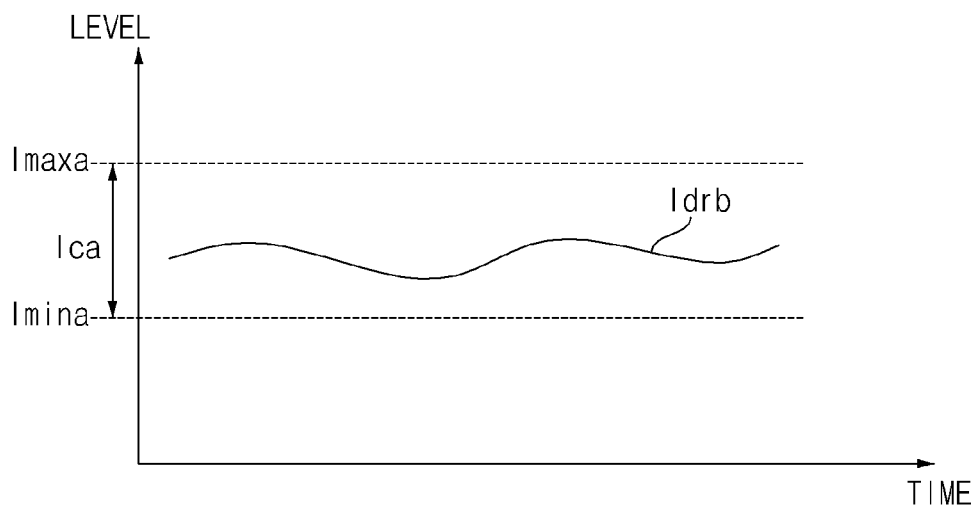

In FIGS. 10A and 10B, when there is no failure in the panel 210, the detected first current Idra, Idrb may be within the first allowable range ICa as shown in FIGS. 11A and 11B, respectively. Accordingly, the controller 170 of the image display apparatus 100 may determine that the timing controller 232 or the panel 210 is normal.

Figure 10C:
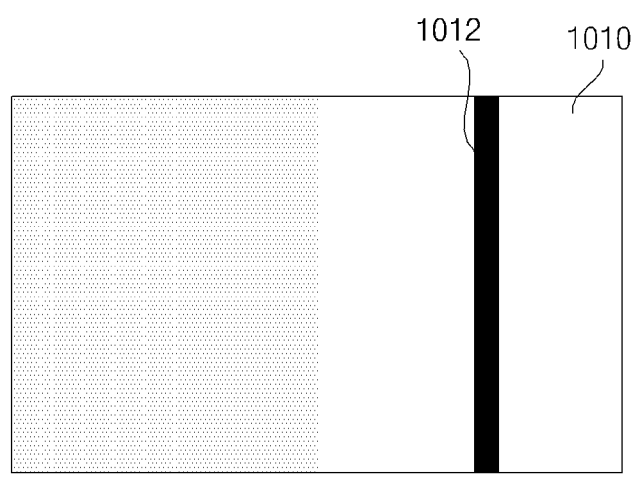
Figure 10D:
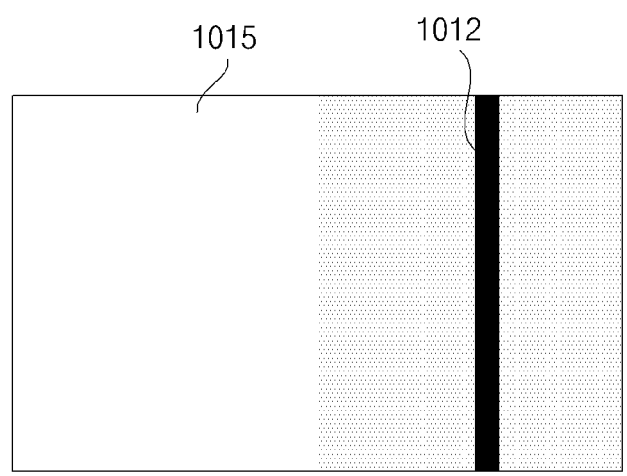

FIG. 10C illustrates that the pattern image 1010 having a black left side and a white right side is displayed, and FIG. 10D illustrates that the pattern image 1015 having a white left side and a black right side.

Figure 11C:
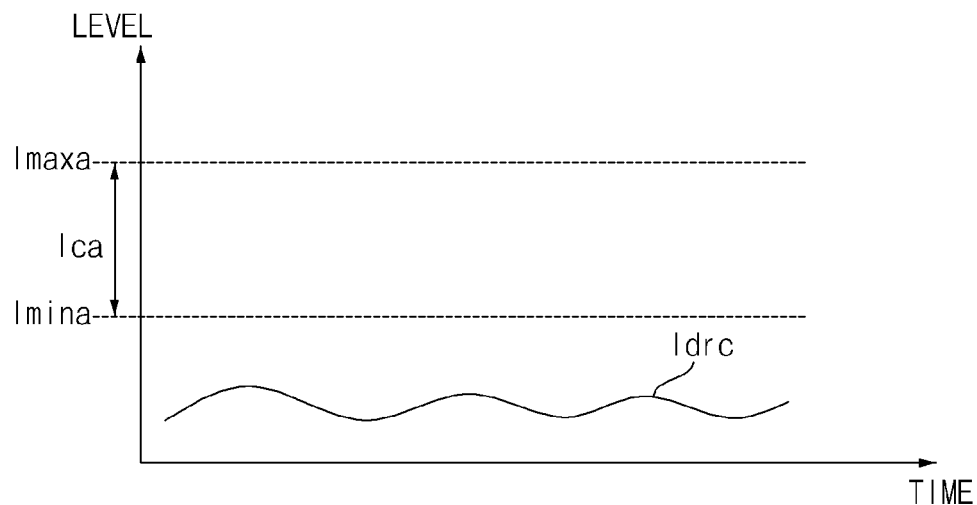

In a state where a line defact 1012 exists in the right side of the panel 210 in the vertical direction, when the pattern image 1010 shown in FIG. 10C is displayed, the detected first current Idrc may deviate from the first allowable range Ica, as shown in FIG. 11C. As shown in FIG. 11C, it may be smaller than the minimum current Imina.

Accordingly, the controller 170 of the image display apparatus 100 may determine that there is a failure in the timing controller 232 or the panel 210. In particular, the controller 170 of the image display apparatus 100 may determine that there is a failure in the right side of the panel 210.

Figure 11D:
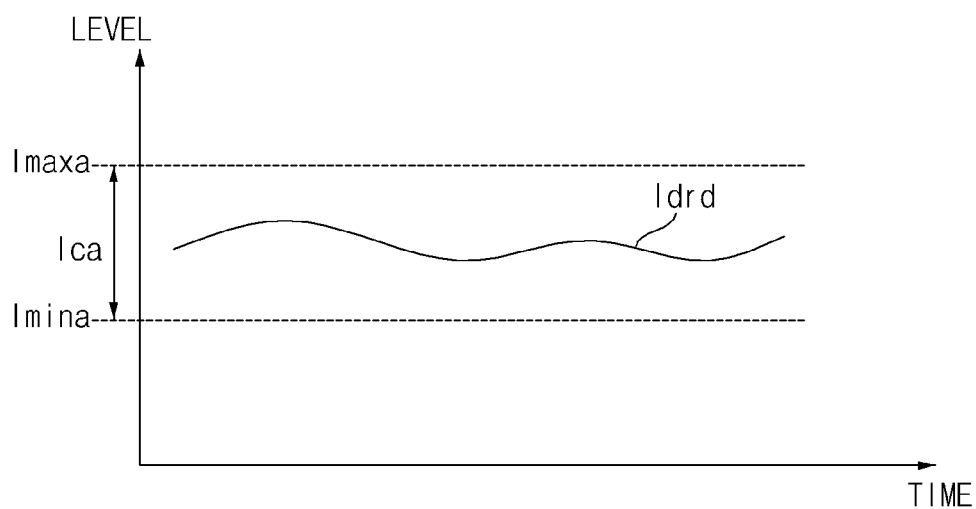

Meanwhile, in a state where a line defact 1012 exists in the right side of the panel 210 in the vertical direction, when the pattern image 1015 shown in FIG. 10D is displayed, the detected first current Idrd may be within the first allowable range Ica, as shown in FIG. 11D.

Figure 10E:
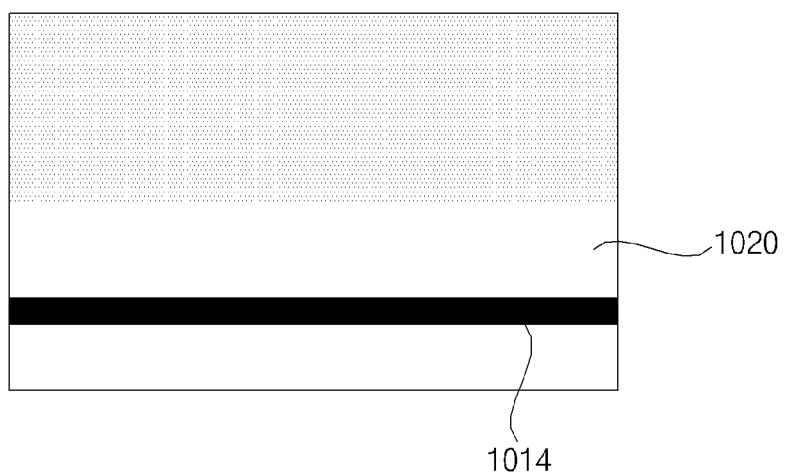
Figure 10F:
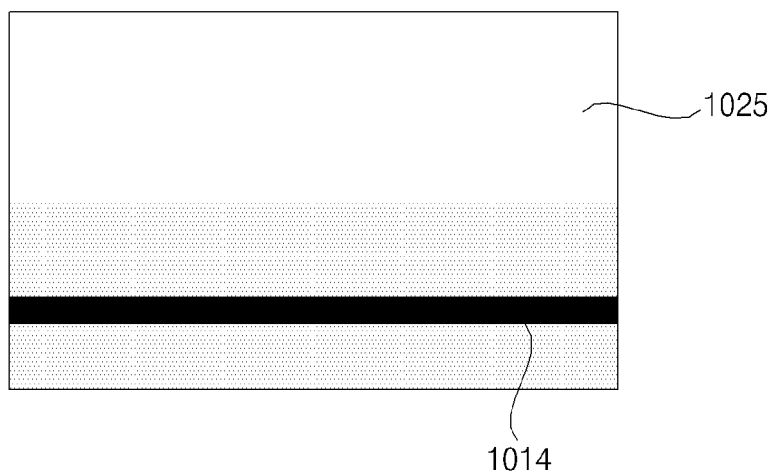

FIG. 10E illustrates that a pattern image 1020 having a black upper side and a white lower side is displayed, and FIG. 10F illustrates that a pattern image 1025 having a white upper side and a black lower side.

Figure 11E:
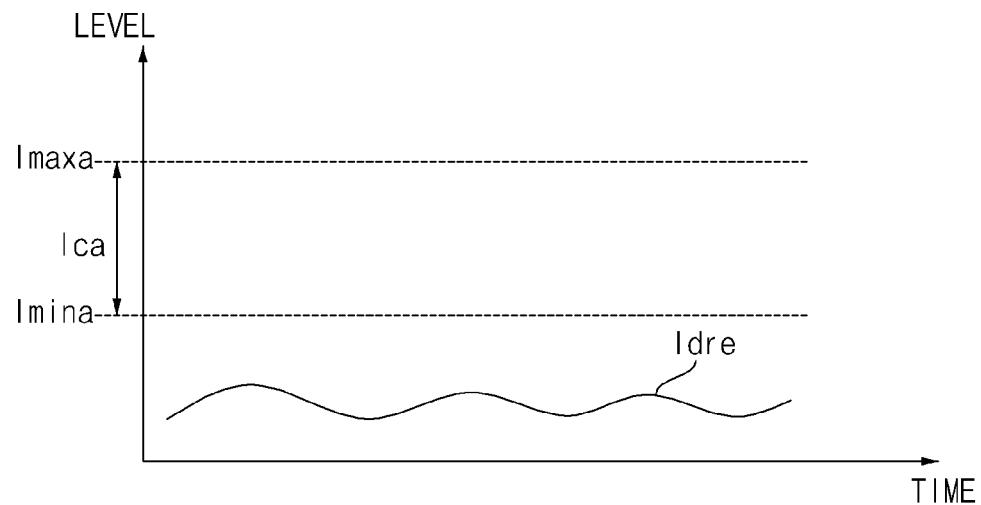

In a state where a line defact 1014 exists in the lower side of the panel 210 in the vertical direction, when a pattern image 1210 shown in FIG. 10E is displayed, the detected first current Idre may deviate from the first allowable range Ica, as shown in FIG. 11E. As shown in FIG. 11E, it may be smaller than the minimum current Imina.

Accordingly, the controller 170 of the image display apparatus 100 may determine that there is a failure in the timing controller 232 or the panel 210. In particular, the controller 170 of the image display apparatus 100 may determine that there is a failure in a lower side of the panel 210.

Figure 11F:
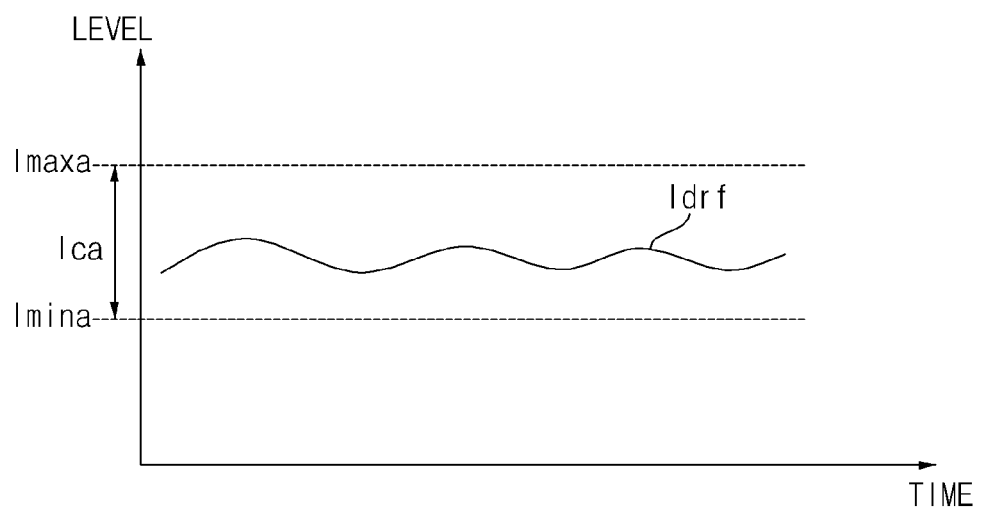

Meanwhile, when the pattern image 1025 shown in FIG. 10F is displayed in a state where the line defact 1014 exists in a lower side of the panel 210 in the horizontal direction, the detected first current Idrf may be within the first allowable range Ica, as shown in FIG. 11F.

Figure 12A:
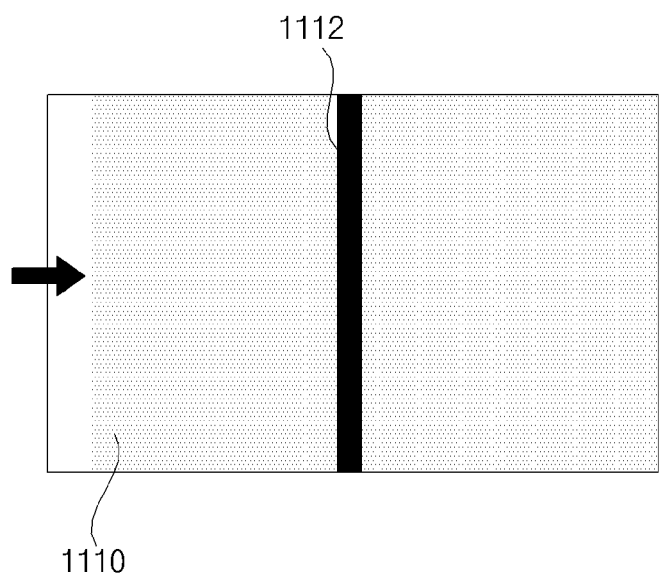
Figure 12B:
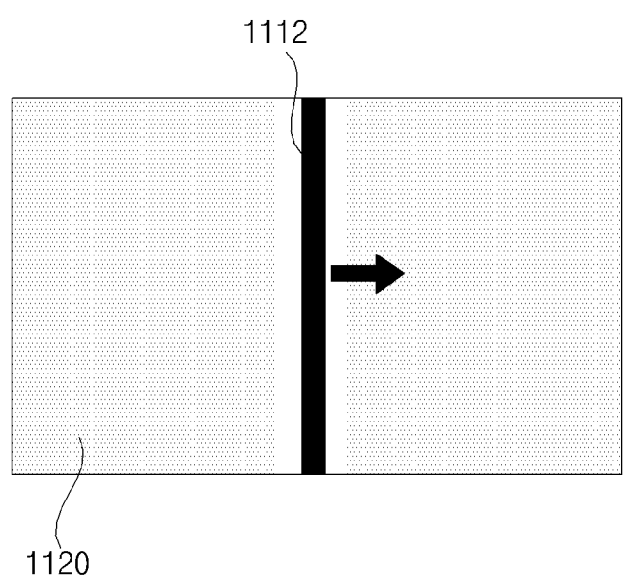
Figure 12C:
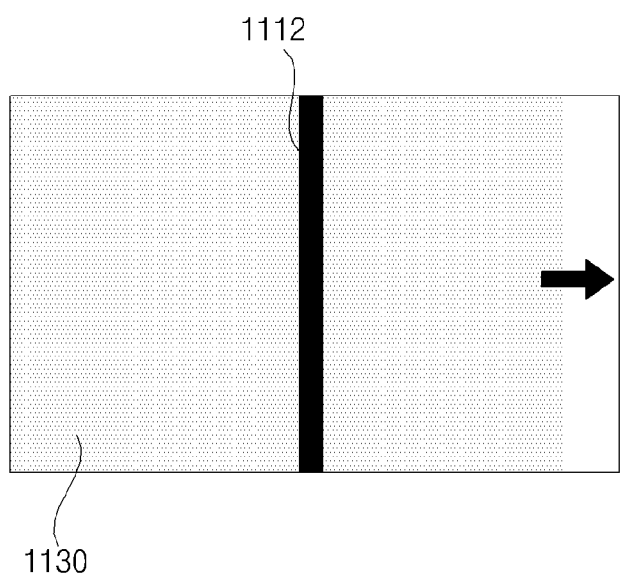

Meanwhile, FIGS. 12A to 12C illustrate sequential pattern images 1110, 1120, and 1130 in which a white area is moved from left to right.

Figure 13A:
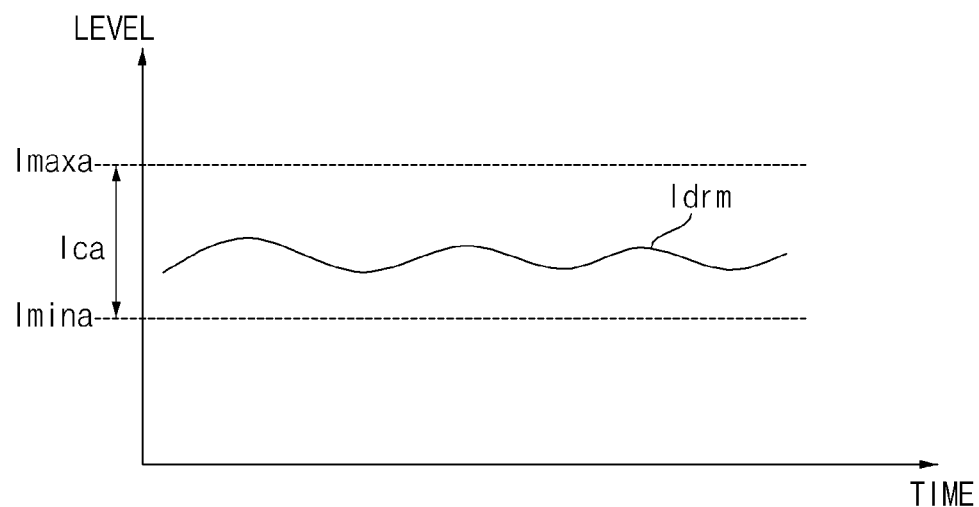

In a state in which a line defect 1112 exists in a center of the panel 210 in the vertical direction, when a pattern image 1110 shown in FIG. 12A is displayed, the detected first current Idrm may be within the first acceptable range Ica, as shown in FIG. 13A.

Figure 13B:
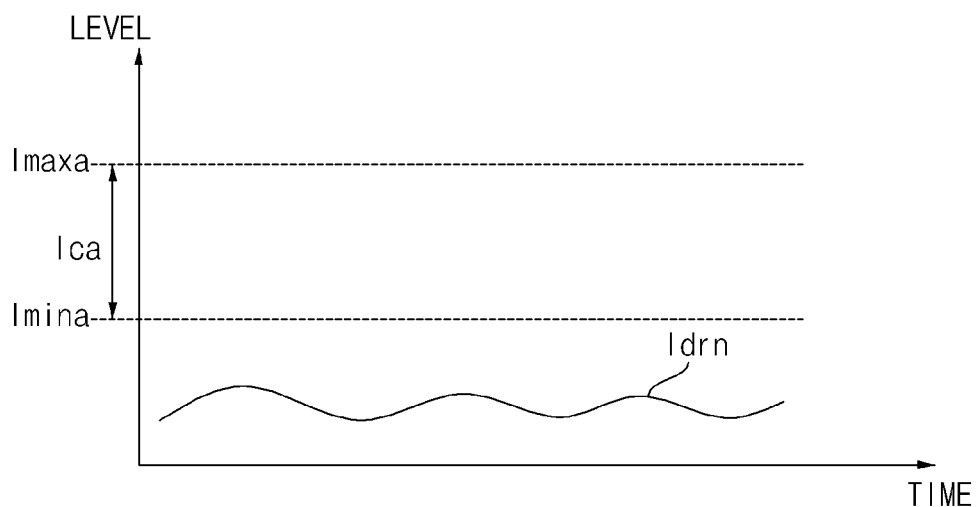

In a state in which the line defect 1112 exists in the center of the panel 210 in the vertical direction, when a pattern image 1120 shown in FIG. 12B is displayed, the detected first current Idm may be within the first acceptable range Ica, as shown in FIG. 13B. It may be smaller than the minimum current Imina.

Accordingly, the controller 170 of the image display apparatus 100 may determine that there is a failure in the timing controller 232 or the panel 210. In particular, the controller 170 of the image display apparatus 100 may determine that there is a failure in the center of the panel 210.

Figure 13C:
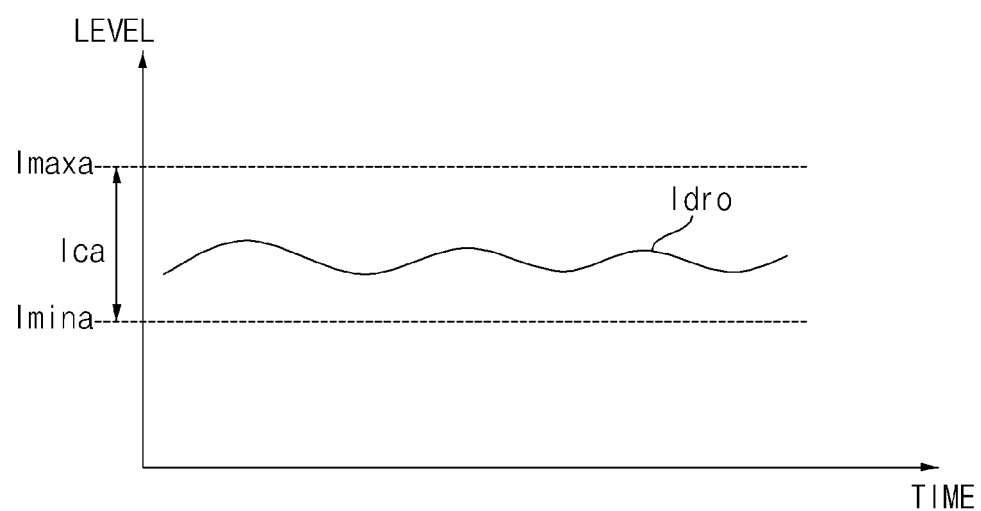

Meanwhile, in a state in which the line defect 1112 exists in the center of the panel 210 in the vertical direction, when a pattern image 1130 shown in FIG. 12C is displayed, the detected first current Idro may be within the first acceptable range Ica, as shown in FIG. 13C.

Figure 14A:
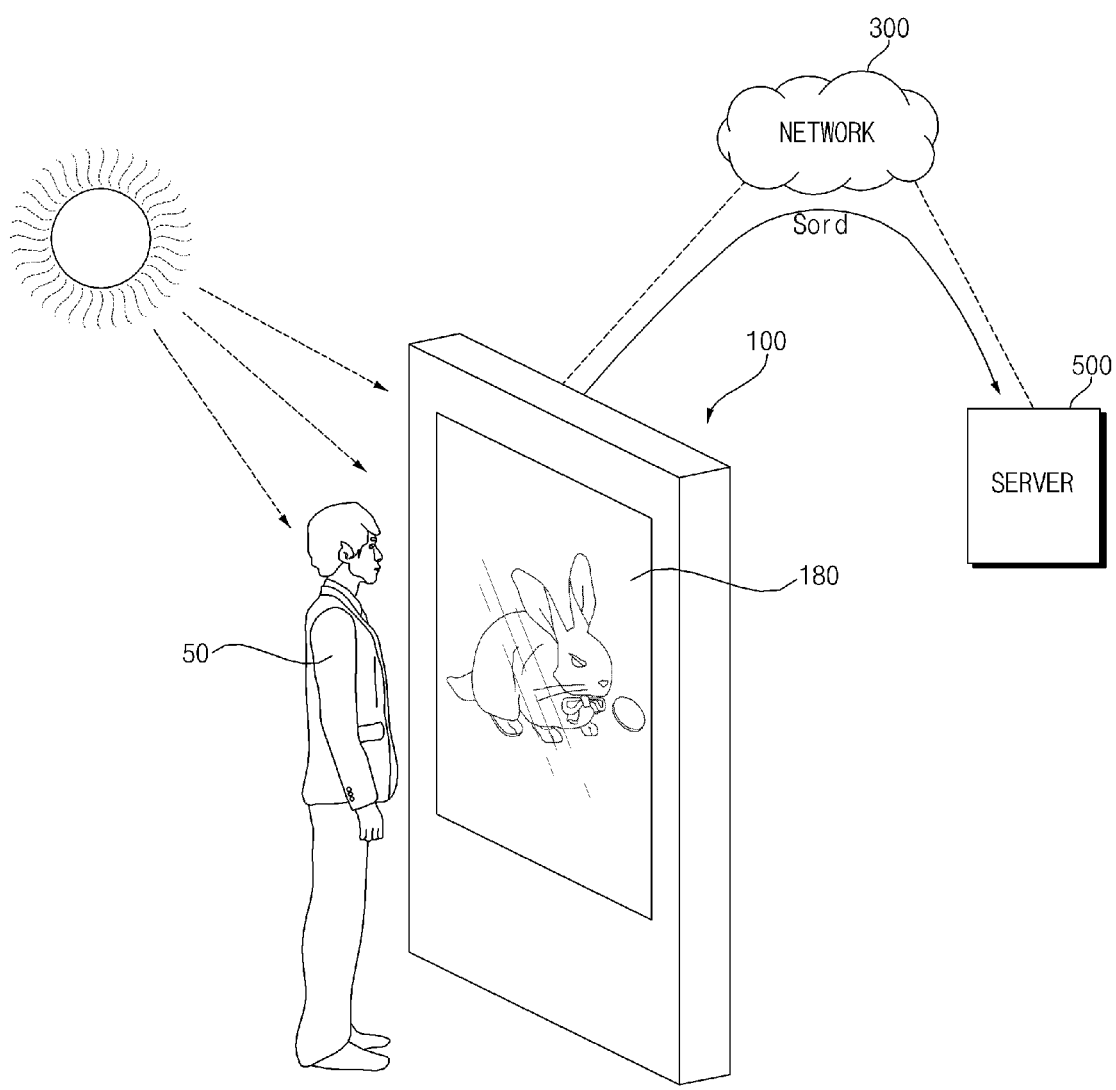

Meanwhile, FIG. 14A illustrates that the image display apparatus 100 transmits a normal signal Sord for the timing controller 232 or the panel 210 to a server 500 via the network 300, when the detected first current is within the first allowable range.

Accordingly, a manager who is located in a remote place can easily determine that the timing controller 232 or the panel 210 of the image display apparatus 100 operates normally.

Figure 14B:
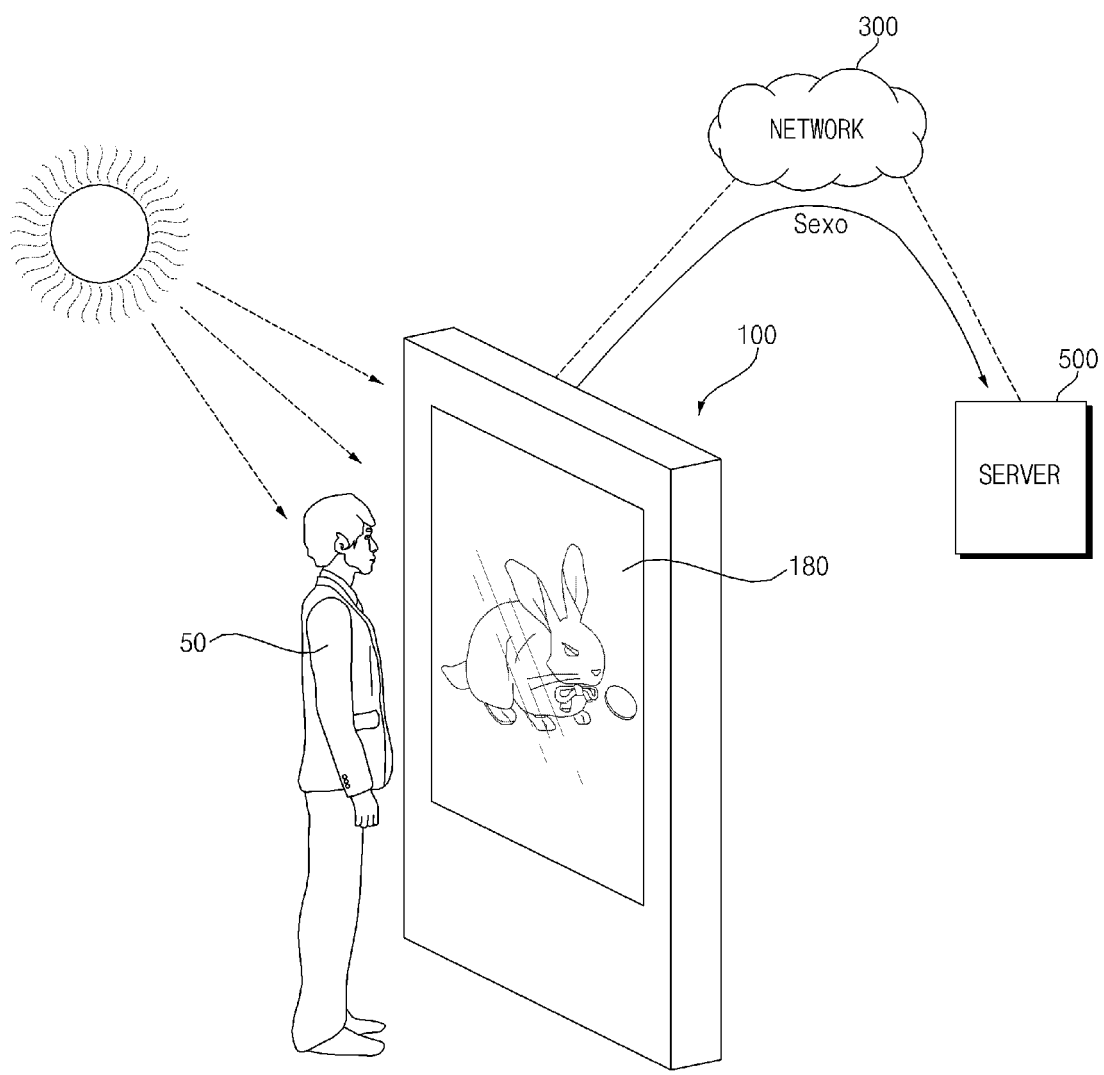

Next, FIG. 14B illustrates that the image display apparatus 100 transmits a failure signal Sexo for the timing controller 232 or the panel 210 to the server 500 via the network 300, when the detected first current deviates from the first allowable range.

Accordingly, the manager who is located in a remote place can easily determine that the timing controller 232 or the panel 210 of the image display apparatus 100 is failed.

Figure 15A:
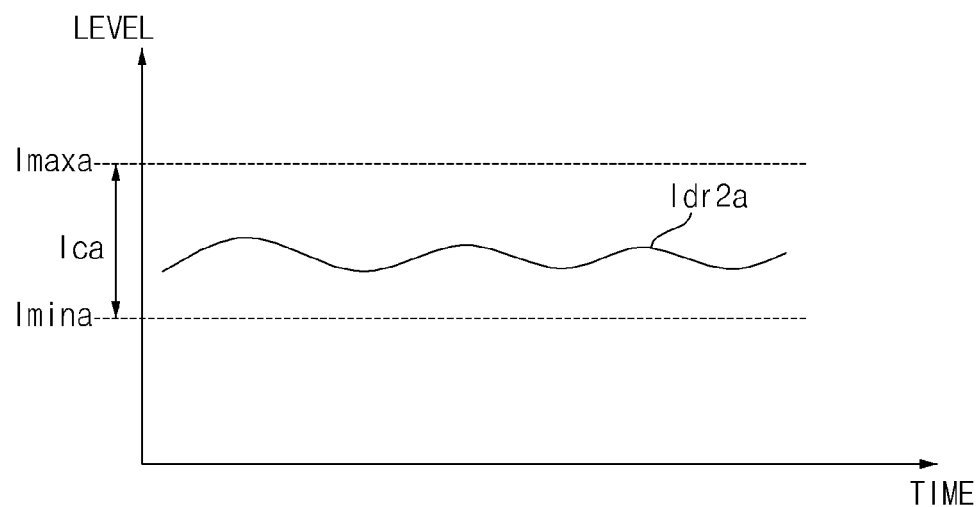

Meanwhile, FIG. 15A illustrates that the second current Idr2a detected by the second current detector CD2 is within the second allowable range ICa.

Figure 16A:
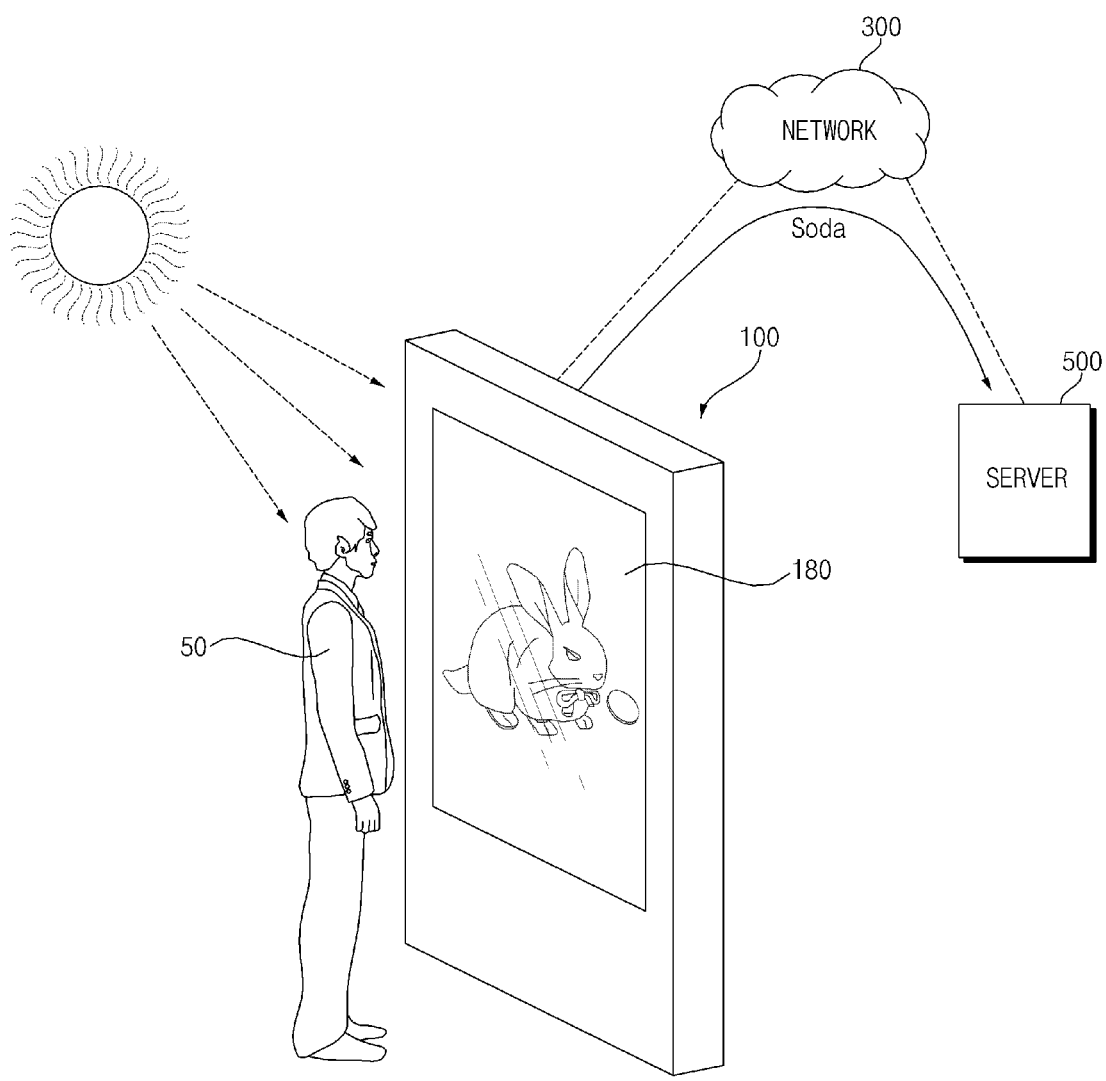

When the current Idr2a is within the second allowable range ICa as shown in FIG. 15A, FIG. 16A illustrates that the image display apparatus 100 transmits a normal signal Soda for the backlight 250 to the server 500 via the network 300.

Accordingly, the manager who is located in a remote place can easily determine that the backlight 250 of the image display apparatus 100 operates normally.

Figure 15B:
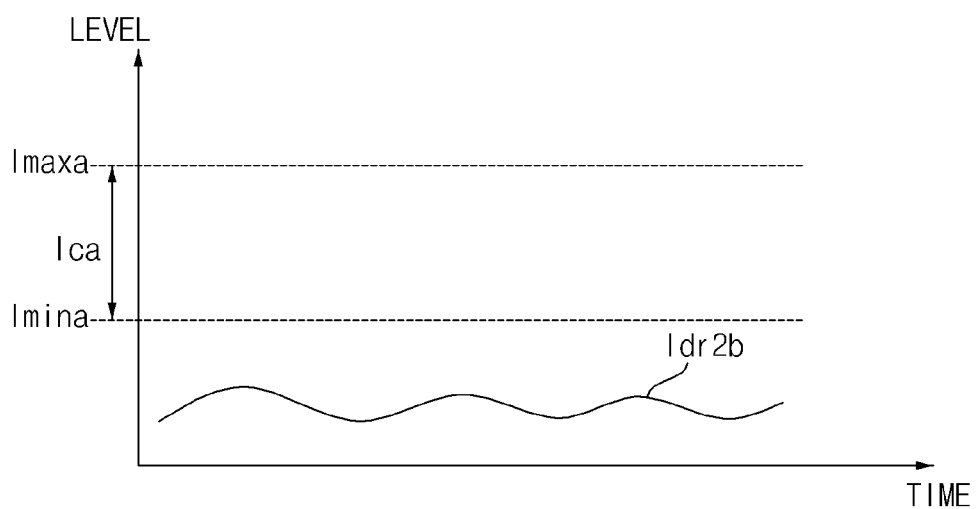

Meanwhile, FIG. 15B illustrates that the second current Idr2a detected by the second current detector CD2 deviates from the second allowable range ICa, and in particular, the second current Idr2a is less than or equal to the minimum current Imina.

Figure 16B:
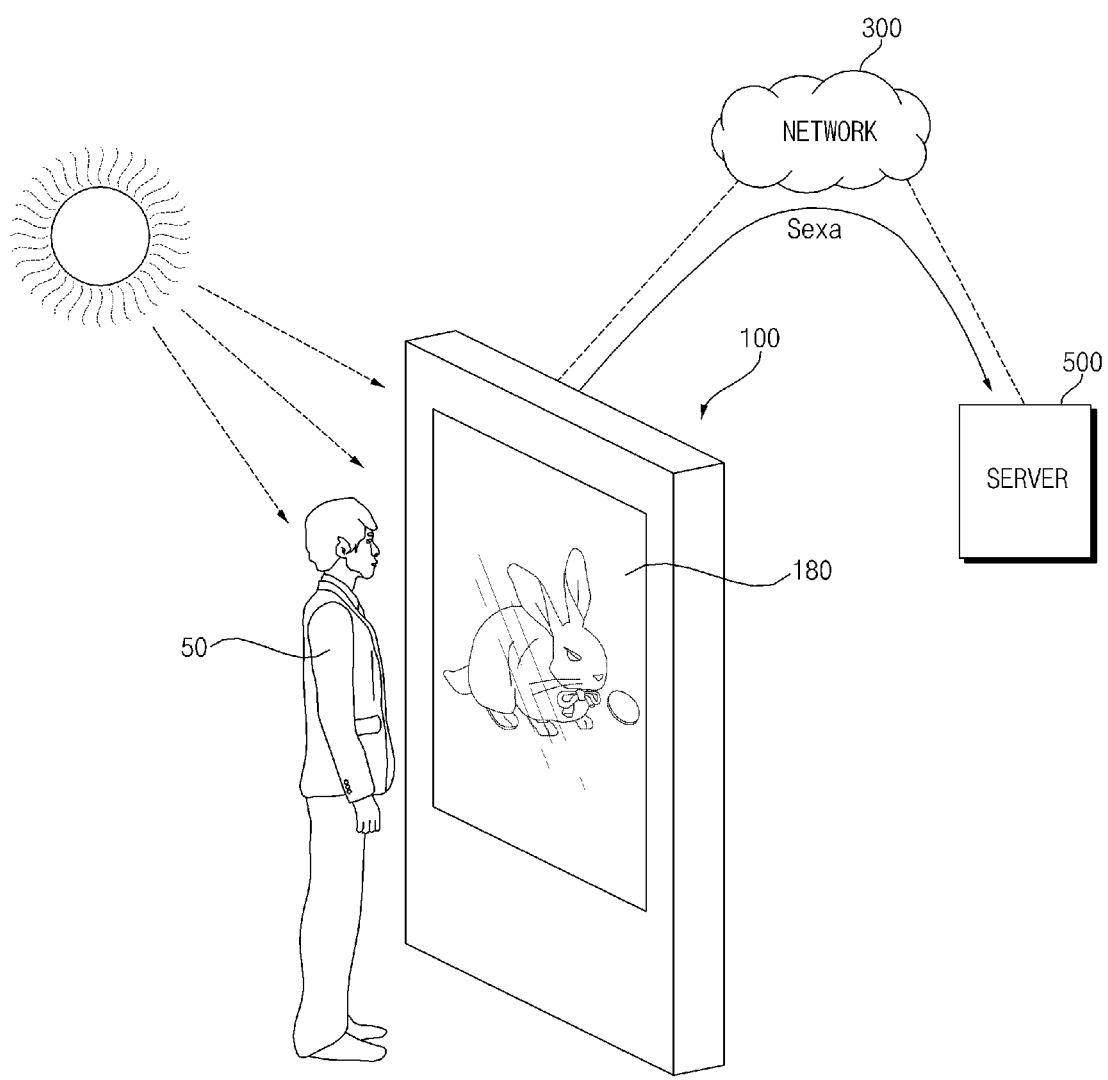

When the current Idr2a deviates from the second allowable range ICa as shown in FIG. 15B, FIG. 16B illustrates that the image display apparatus 100 transmits a failure signal Sexa for the backlight 250 to the server 500 via the network 300.

Accordingly, the manager who is located in a remote place can easily determine that the backlight 250 of the image display apparatus 100 is failed.

Figure 17A:
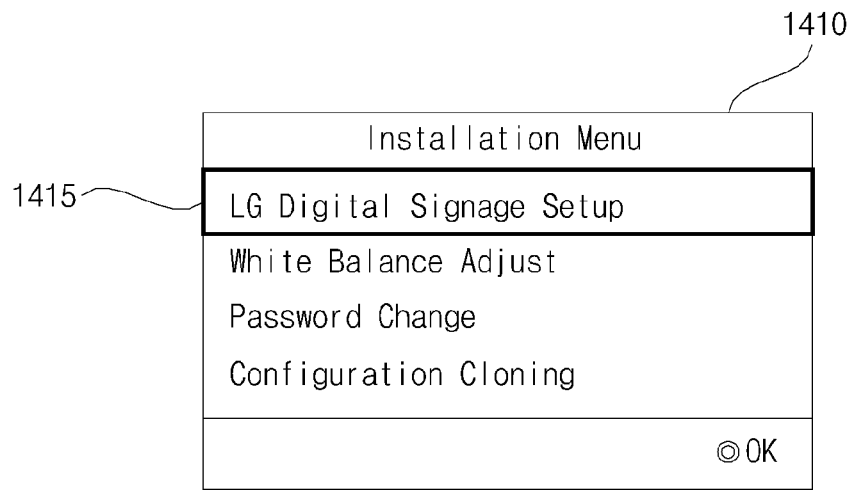

Meanwhile, the controller 170 may control to display a menu screen 1410 as shown in FIG. 17A, according to a certain input from a remote location, or when the power is turned on, or periodically.

Figure 17B:
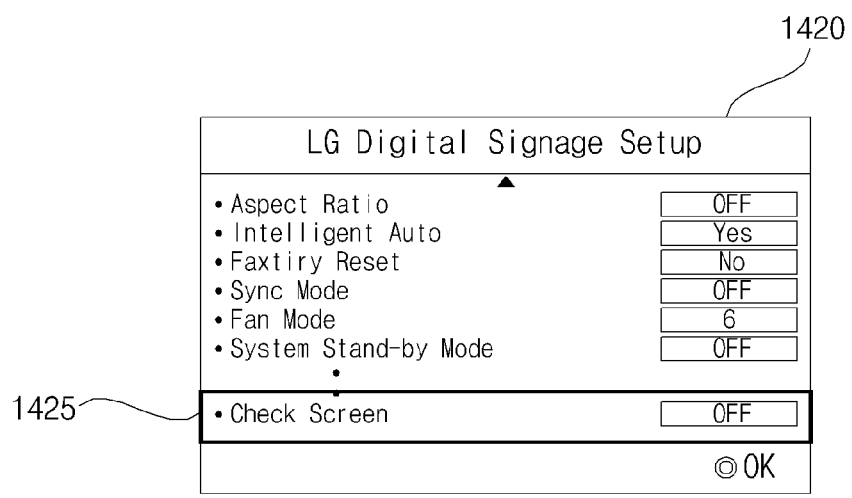
Figure 17C:
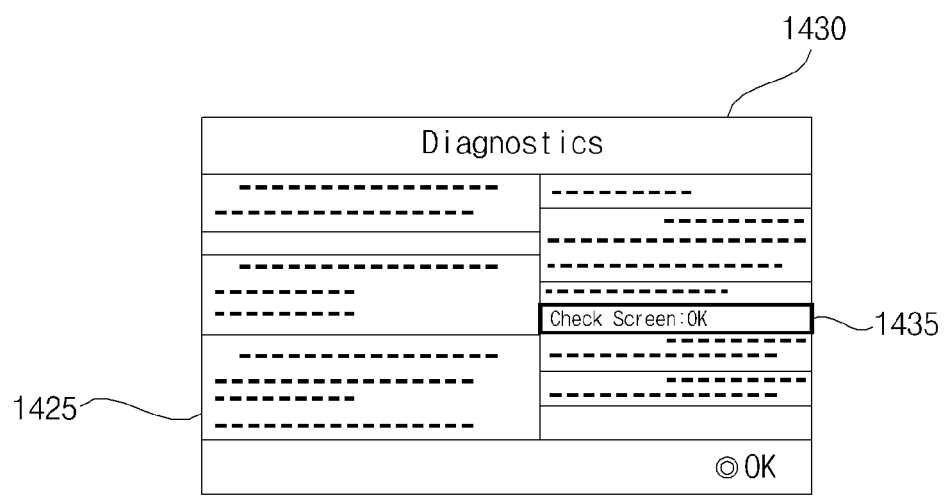

In addition, when a setting item 1415 is selected from among a plurality of items in the menu screen 1410, the controller 170 may control to display a setting screen 1420 as shown in FIG. 17B.

The setting screen 1420 may include a screen check item 1425.

Meanwhile, when the screen check item 1425 in the setting screen 1420 is selected, the controller 170 may control to display the first pattern image and the second pattern image as shown in the flowchart of FIG. 9.

That is, the controller 170 may control to display the image 810 of FIG. 8A, or the images of FIGS. 10A to 10F respectively.

Alternatively, the controller 170 may control to display the images of FIGS. 12A to 12C, respectively.

The controller 170 may receive the first current to the third current from the first current detector to the third current detector CD1 to CD3 respectively, while displaying the first pattern image, the second pattern image, and the like, and determines whether it is within the allowable range, thereby determining whether there is a failure with respect to at least one of the timing controller 232, the panel 210, and the backlight 250. Therefore, even in a remote location, it is possible to easily determine whether the image display apparatus 100 is failed.

The image display apparatus according to the embodiment of the present disclosure is not limited to the configuration and method of the embodiments described above, but the above embodiments may be configured by selectively combining all or some of the embodiments so that various modifications can be achieved.

Although the exemplary embodiments of the present disclosure have been disclosed for illustrative purposes, those skilled in the art will appreciate that various modifications, additions and substitutions are possible, without departing from the scope of the present disclosure as disclosed in the accompanying claims. Accordingly, the scope of the present disclosure is not construed as being limited to the described embodiments but is defined by the appended claims as well as equivalents thereto.

What is claimed is:

1. An image display apparatus comprising:
a controller configured to output an image signal and a first DC power;
a display configured to receive the image signal, the first DC power, and a second DC power, and display a certain image based on the image signal; and
a communicator configured to exchange data with a server,
wherein the display comprises:
a first interface electrically connected to the controller and configured to receive the image signal and the first DC power from the controller;
a timing controller configured to output a data driving signal and a gate driving signal based on the image signal from the first interface;
a panel configured to display an image according to the data driving signal and the gate driving signal;

a second interface located apart from the first interface and electrically connected to receive a second DC power;
a backlight configured to output light to the panel based on the second DC power; and
a first current detector configured to detect a first current based on the first DC power applied to the first interface,
wherein the controller is further configured to determine that the timing controller or the panel is failed when the detected first current deviates from a first allowable range, and
wherein the controller is further configured to control a failure signal of the timing controller or the panel to be transmitted to the server when the detected first current deviates from a first allowable range.

2. The image display apparatus of claim 1, wherein the controller is further configured to control the failure signal of the timing controller or the panel to be transmitted to the server when the detected first current is equal to or less than a minimum level.

3. The image display apparatus of claim 1, wherein the display further comprises:
a power supply device configured to supply operation power to the data driver;
a second current detector configured to detect a second current based on the second DC power applied to the second interface; and
a third current detector disposed between the first interface and the power supply device, and configured to detect a third current based on the first DC power outputted from the first interface;
wherein the controller is further configured to determine that the panel is failed; when the detected third current deviates from a third allowable range.

4. The image display apparatus of claim 3, wherein the controller is further configured to determine that the timing controller is failed; when the detected first current deviates from the first allowable range; and the detected third current does not deviate from the third allowable range.

5. The image display apparatus of claim 3,
wherein the controller is further configured to control a failure signal of the panel to be transmitted to the server when the detected third current deviates from the third allowable range.

6. The image display apparatus of claim 5, wherein the controller is further configured to control the failure signal of the panel to be transmitted to the server when the detected third current is equal to or less than a minimum level.

7. The image display apparatus of claim 1, wherein the controller is further configured to:
control a first pattern image to be displayed during a first period,
control, when the first pattern image is displayed, a second pattern image during a second period when the detected first current deviates from the first allowable range and is equal to or less than a first minimum level, and
determine that the panel is failed; when the detected second current is equal to or less than a second minimum level, when the second pattern image is displayed.

8. The image display apparatus of claim 7, wherein the controller is further configured to determine, when the second pattern image is a plurality of sequential pattern images, a failure position of the panel based on the sequential pattern image and the detected first current.

9. The image display apparatus of claim 7, wherein the controller is further configured to:
control a setting screen to be displayed when a setting item is selected from menu item, and
control the first pattern image and the second pattern image to be displayed when a screen check item in the setting screen is selected.

10. An image display apparatus comprising:
a controller configured to output an image signal and a first DC power;
a display configured to receive the image signal, the first DC power, and a second DC power, and display a certain image based on the image signal; and
a communicator configured to exchange data with a server,
wherein the display comprises:
a first interface electrically connected to the controller and configured to receive the image signal and the first DC power from the controller;
a timing controller configured to output a data driving signal and a gate driving signal based on the image signal from the first interface;
a panel configured to display an image according to the data driving signal and the gate driving signal;
a second interface located apart from the first interface and electrically connected to receive a second DC power;
a backlight configured to output light to the panel based on the second DC power; and
a first current detector configured to detect a first current based on the first DC power applied to the first interface,
a second current detector configured to detect a second current based on the second DC power applied to the second interface,
wherein the controller is further configured to determine that the timing controller or the panel is failed when the detected first current deviates from a first allowable range, and
wherein the controller is further configured to determine that the backlight is failed when the detected second current deviates from a second allowable range.

11. The image display apparatus of claim 10, further comprising a communicator configured to exchange data with a server,
wherein the controller is further configured to determine a failure signal of the backlight to be transmitted to the server when the detected second current deviates from the second allowable range.

12. The image display apparatus of claim 11, wherein the controller is further configured to control the failure signal of the timing controller or the panel to be transmitted to the server when the detected first current deviates from the first allowable range; and the detected second current does not deviate from the second allowable range.

13. An image display apparatus comprising:
a controller configured to output an image signal and a first DC power;
a display configured to receive the image signal, the first DC power, and a second DC power, and display a certain image based on the image signal; and
a communicator configured to exchange data with a server,
wherein the display comprises:
a first interface electrically connected the controller and configured to receive the image signal and the first DC power from the controller;

a timing controller configured to output a data driving signal and a gate driving signal based on the image signal from the first interface;

a panel configured to display an image according to the data driving signal and the gate driving signal;

a second interface located apart from the first interface and electrically connected to receive a second DC power;

a data driver configured to output a data signal to the panel based on the second DC power; and a first current detector configured to detect a first current based on the first DC power applied to the first interface, wherein the controller is further configured to determine that the timing controller or the panel is failed when the detected first current deviates from a first allowable range, and wherein the controller is further configured to control a failure signal of the timing controller or the panel to be transmitted to the server when the detected first current deviates from a first allowable range.

14. The image display apparatus of claim 13, further comprising a second current detector configured to detect a second current based on the second DC power applied to the second interface, wherein the controller controls is further configured to control the failure signal of the panel to be transmitted to the server when the detected second current deviates from a second allowable range.

15. The image display apparatus of claim 14, wherein the controller is further configured to control the failure signal of the timing controller to be transmitted to the server when the detected first current deviates from the first allowable range and the detected second current does not deviate from the second allowable range.

16. The image display apparatus of claim 13, wherein the display further comprises:

a power supply device configured to supply operation power to the data driver;

a second current detector configured to detect a second current based on the second DC power applied to the second interface; and a third current detector disposed between the first interface and the power supply device, and configured to detect a third current based on the first DC power outputted from the first interface;

wherein the controller is further configured to determine that the panel is failed; when the detected third current deviates from a third allowable range.

17. The image display apparatus of claim 13, wherein the controller is further configured to:

control a first pattern image to be displayed during a first period, control, when the first pattern image is displayed, a second pattern image during a second period when the detected first current deviates from the first allowable range and is equal to or less than a first minimum level, and determine that the panel is failed; when the detected second current is equal to or less than a second minimum level, when the second pattern image is displayed.

18. The image display apparatus of claim 17, wherein the controller is further configured to determine, when the second pattern image is a plurality of sequential pattern images, a failure position of the panel based on the sequential pattern image and the detected first current.

\* \* \* \* \*